United States Patent
Tsai et al.

(10) Patent No.: US 12,476,140 B2
(45) Date of Patent: Nov. 18, 2025

(54) SEMICONDUCTOR PACKAGE INCLUDING STEP SEAL RING AND METHODS FORMING SAME

(71) Applicant: Taiwan Semiconductor Manufacturing Co., Ltd., Hsinchu (TW)

(72) Inventors: Sheng-Han Tsai, Hsinchu (TW); Yuan Sheng Chiu, Miaoli (TW); Chou-Jui Hsu, Taoyuan (TW); Tsung-Shu Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 463 days.

(21) Appl. No.: 17/819,341

(22) Filed: Aug. 12, 2022

(65) Prior Publication Data

US 2023/0386908 A1 Nov. 30, 2023

Related U.S. Application Data

(60) Provisional application No. 63/365,354, filed on May 26, 2022.

(51) Int. Cl.
*H01L 21/768* (2006.01)
*H01L 23/00* (2006.01)

(52) U.S. Cl.
CPC .. *H01L 21/76829* (2013.01); *H01L 21/76807* (2013.01); *H01L 24/03* (2013.01);
(Continued)

(58) Field of Classification Search
CPC ......... H01L 24/01; H01L 24/02; H01L 24/03; H01L 23/538; H01L 23/5382;
(Continued)

(56) References Cited

U.S. PATENT DOCUMENTS 11,063,038 B2 7/2021 Thei et al.
2006/0055005 A1 3/2006 Furusawa et al.
(Continued)

FOREIGN PATENT DOCUMENTS

JP 2006080369 A 3/2006
JP 2018026499 A 2/2018
(Continued)

*Primary Examiner* — Thanhha S Pham
(74) *Attorney, Agent, or Firm* — Slater Matsil, LLP

(57) ABSTRACT

A method includes forming a plurality of dielectric layers over a semiconductor substrate, forming a plurality of metal lines and vias in the plurality of dielectric layers, forming a lower portion of an inner seal ring and a lower portion of an outer seal ring extending into the plurality of dielectric layers, depositing a first dielectric layer over the plurality of metal lines and vias, and etching the first dielectric layer to form an opening penetrating through the first dielectric layer. After the first dielectric layer is etched, a top surface of the lower portion of the inner seal ring is exposed, and an entire topmost surface of the lower portion of the outer seal ring is in contact with a bottom surface of the first dielectric layer. An upper portion of the inner seal ring is then formed to extend into the opening and to join the lower portion of the inner seal ring. A second dielectric layer is deposited to cover the upper portion of the inner seal ring.

20 Claims, 19 Drawing Sheets

(52) U.S. Cl.
CPC .... *H01L 24/06* (2013.01); *H01L 2224/02235* (2013.01); *H01L 2224/02251* (2013.01); *H01L 2224/03011* (2013.01); *H01L 2224/06151* (2013.01); *H01L 2224/06155* (2013.01); *H01L 2224/06179* (2013.01); *H01L 2924/35* (2013.01)

(58) Field of Classification Search
CPC ............. H01L 23/5383; H01L 23/5384; H01L 23/5385; H01L 23/5389; H01L 21/768; H01L 21/76801; H01L 21/26802; H01L 21/76804; H01L 21/76805; H01L 21/76807; H01L 21/76832
See application file for complete search history.

(56) References Cited

U.S. PATENT DOCUMENTS

| | | |
|---|---|---|
| 2012/0241981 A1 | 9/2012 | Hirano |
| 2015/0348916 A1 | 12/2015 | Chen et al. |
| 2016/0118352 A1* | 4/2016 | Ishii ................. H01L 23/562 257/620 |
| 2017/0186732 A1 | 6/2017 | Chu et al. |
| 2018/0047680 A1 | 2/2018 | Uchida et al. |
| 2019/0363079 A1* | 11/2019 | Thei .................. H01L 24/89 |
| 2020/0243516 A1 | 7/2020 | Thei et al. |
| 2024/0266304 A1 | 8/2024 | Liu et al. |

FOREIGN PATENT DOCUMENTS

| | | |
|---|---|---|
| KR | 20150137967 A | 12/2015 |
| KR | 20170078538 A | 7/2017 |
| KR | 20220004943 A | 1/2022 |
| TW | 202005036 A | 1/2020 |
| TW | 202211476 A | 3/2022 |

* cited by examiner

SEMICONDUCTOR PACKAGE INCLUDING STEP SEAL RING AND METHODS FORMING SAME

PRIORITY CLAIM AND CROSS-REFERENCE

This application claims the benefit of the following provisionally filed U.S. Patent application: Application No. 63/365,354, filed on May 26, 2022, and entitled "SoIC Step SR Design on Die Corner," which application is hereby incorporated herein by reference.

BACKGROUND

The packages of integrated circuits are becoming increasing complex, with more device dies integrated in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and achieve optimized device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
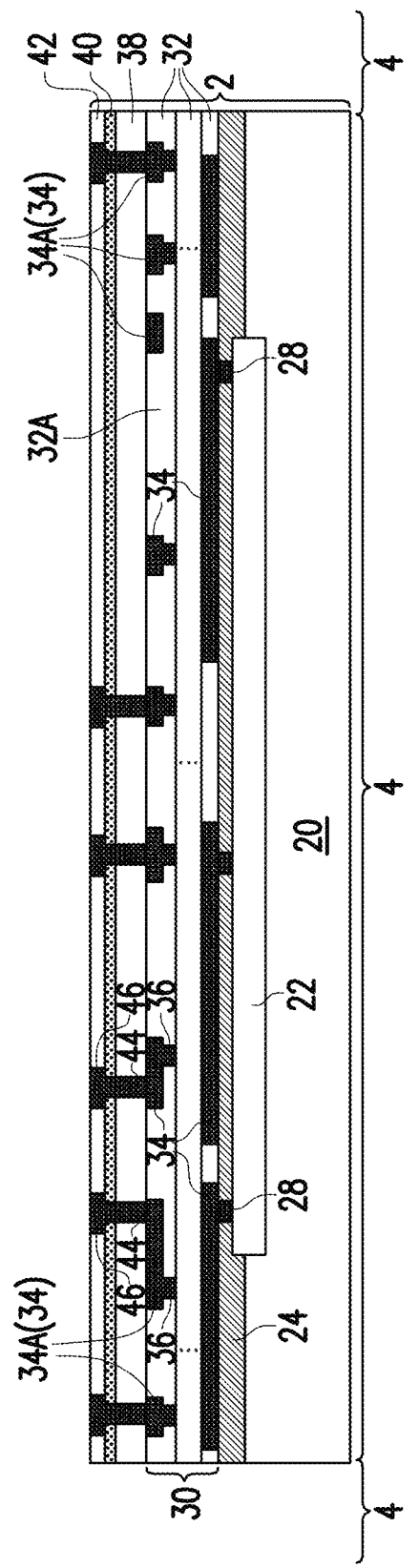
FIGS. 1-8 illustrate cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various embodiments. The package may include a device die, which may include an inner seal ring and an outer seal ring encircling the inner seal ring. The inner seal ring may include a lower portion and an upper portion. The lower portion may comprise copper, and the upper portion may include aluminum. The outer seal ring may be free from the aluminum upper portion, or may include a narrow aluminum upper portion narrower than the aluminum upper portion of the inner seal ring. With the outer seal ring having no aluminum ring or a narrow aluminum ring, when the device die is bonded to another package component such as another device die or a carrier, the cracking and/or non-bonding issues at the corners of the device die is reduced. The intermediate stages of forming the package are illustrated in accordance with some embodiments. Some variations of some embodiments are discussed. Throughout the various views and illustrative embodiments, like reference numbers are used to designate like elements. It is appreciated that although the formation of packages is used as examples to explain the concept of the embodiments of the present disclosure, the embodiments of the present disclosure are readily applicable to other bonding methods and structures in which metal pads and vias are bonded to each other.

FIGS. 1 through 8 illustrate the cross-sectional views of intermediate stages in the formation of a package in accordance with some embodiments of the present disclosure. The processes as shown in FIGS. 1 through 8 are also reflected schematically in the process flow 200 shown in FIG. 19.

Figure 19:
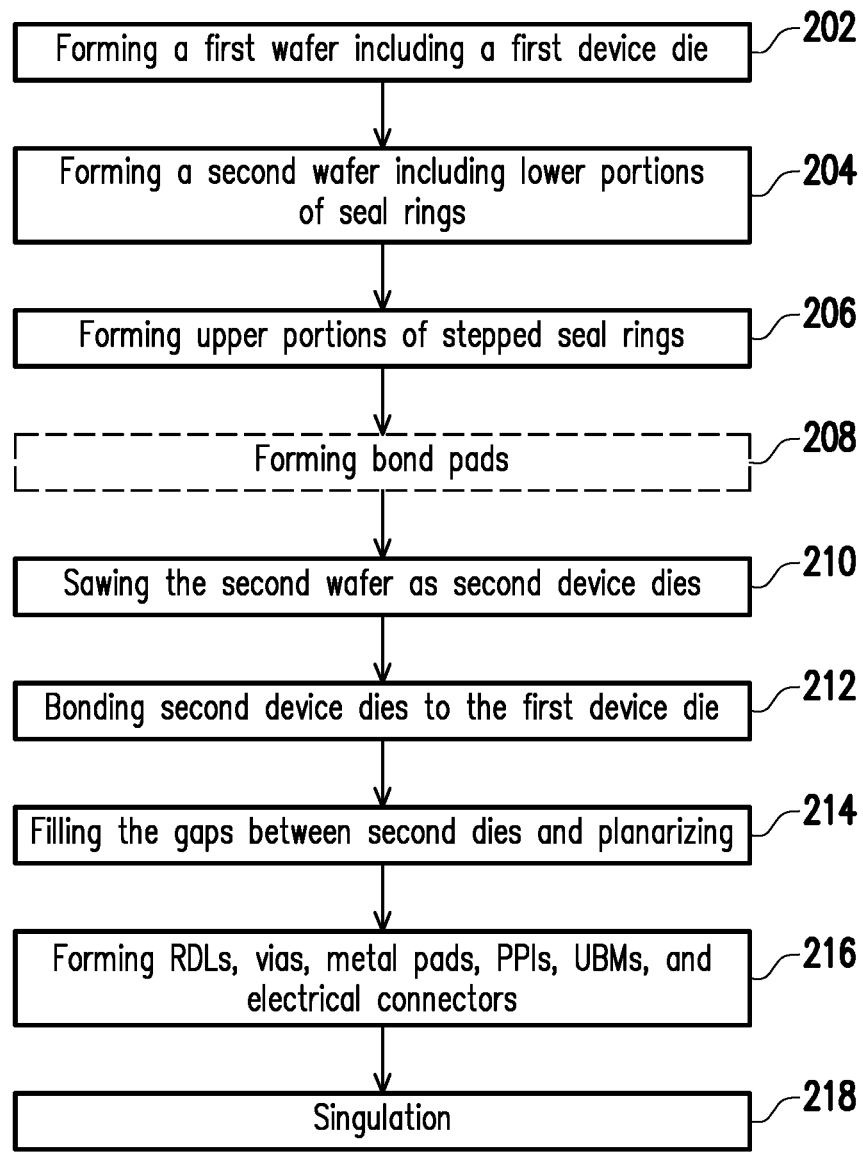
FIG. 19 illustrates a process flow for forming a package in accordance with some embodiments.

FIG. 1 illustrates the cross-sectional view in the formation of package component 2 in accordance with some embodiments. The respective process is illustrated as process 202 in the process flow 200 as shown in FIG. 19. In accordance with some embodiments, package component 2 is a device wafer including active devices 22 such as transistors and/or diodes, and possibly passive devices such as capacitors, inductors, resistors, or the like. Package component 2 may include a plurality of chips 4 therein, with one of chips 4 illustrated. Chips 4 are alternatively referred to as (device) dies hereinafter. In accordance with some embodiments, device die 4 is a logic die, which may be a Central Processing Unit (CPU) die, a Micro Control Unit (MCU) die, an input-output (IO) die, a BaseB and (BB) die, an Application processor (AP) die, or the like. Device die 4 may also be a memory die such as a Dynamic Random-Access Memory (DRAM) die or a Static Random-Access Memory (SRAM) die.

Figure 2:
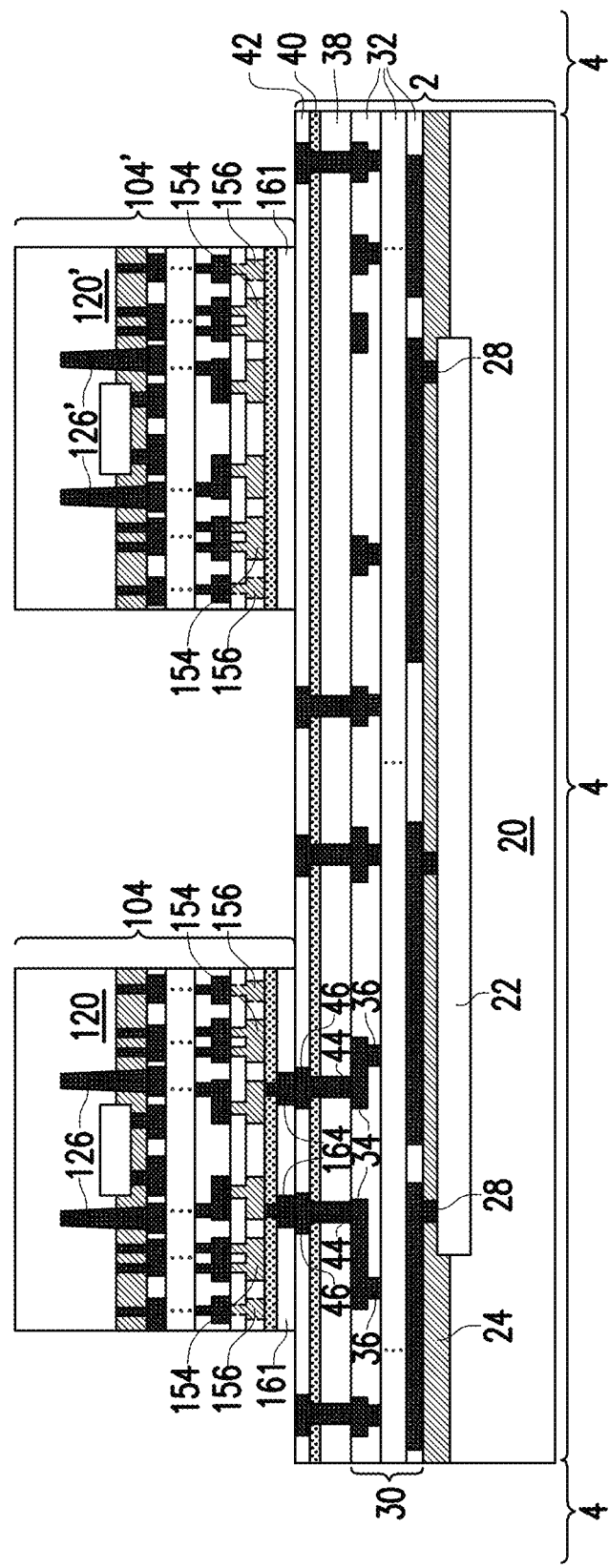

In accordance with alternative embodiments of the present disclosure, package component 2 is a carrier, which may be formed of a homogenous material such as silicon. In accordance with some embodiments, carrier 2 includes substrate 20, which may be a silicon substrate. Carrier 2 is free from active devices and passive devices, and is free from routing metal lines. There may be several dielectric layers over substrate 20, with the dielectric layers being used for bonding to the overlying device die 104, as shown in FIG. 2. In accordance with yet alternative embodiments, package component 2 is or comprises an interposer wafer. In subsequent discussion, a device wafer is discussed as an example package component 2. The embodiments of the present disclosure may also be applied to other types of package components such as interposer wafers.

In accordance with some embodiments, wafer 2 includes semiconductor substrate 20 and the features formed at a top surface of semiconductor substrate 20. Semiconductor substrate 20 may be formed of crystalline silicon, crystalline germanium, crystalline silicon germanium, or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be (or may not be) formed to extend into semiconductor substrate 20, and the through-vias are used to electrically inter-couple the features on opposite sides of wafer 2.

In accordance with some embodiments, wafer 2 includes integrated circuit devices 22, which are formed on the top surface of semiconductor substrate 20. Example integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, which are free from active devices and passive devices.

Inter-Layer Dielectric (ILD) 24 is formed over semiconductor substrate 20, and fills the space between the gate stacks of transistors (not shown) in integrated circuit devices 22. In accordance with some embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines 34 and vias 36. In accordance with some embodiments, contact plugs 28 are formed of a conductive material selected from tungsten, aluminum, copper, titanium, tantalum, titanium nitride, tantalum nitride, alloys thereof, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Interconnect structure 30 is formed over ILD 24 and contact plugs 28. Interconnect structure 30 includes dielectric layers 32, and metal lines 34 and vias 36 formed in dielectric layers 32. Dielectric layers 32 are alternatively referred to as Inter-Metal Dielectric (IMD) layers 32 hereinafter. In accordance with some embodiments, at least the lower ones of dielectric layers 32 are formed of a low-k dielectric material having a dielectric constant (k-value) lower than about 3.5 or about 3.0. Dielectric layers 32 may be formed of a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of silicon carbide, silicon nitride, aluminum oxide, aluminum nitride, or the like, or multi-layers thereof, are formed between IMD layers 32, and are not shown for simplicity.

Metal lines 34 and vias 36 are formed in dielectric layers 32. The metal lines 34 at a same level are collectively referred to as a metal layer hereinafter. In accordance with some embodiments, interconnect structure 30 includes a plurality of metal layers that are interconnected through vias 36. Metal lines 34 and vias 36 may be formed through single damascene and/or dual damascene processes. Metal lines 34 and vias 36 may include diffusion barriers and copper-containing metallic materials over the corresponding diffusion barriers. The diffusion barriers may include titanium, titanium nitride, tantalum, tantalum nitride, or the like.

Metal lines 34 include metal lines/pads 34A, which are sometimes referred to as top metal lines. Top metal lines/pads 34A are also collectively referred to as being a top metal layer. The respective dielectric layer 32A may be formed of a non-low-k dielectric material such as Un-doped Silicate Glass (USG), silicon oxide, silicon nitride, and/or the like. Dielectric layer 32A may also be formed of a low-k dielectric material, which may be selected from the similar candidate materials of the underlying IMD layers 32.

In accordance with some embodiments, dielectric layers 38, 40, and 42 are formed over the top metal layer. Dielectric layers 38 and 42 may be formed of silicon oxide, silicon oxynitride, silicon oxy-carbide, or the like. Dielectric layer 40 is formed of a dielectric material different from the dielectric material of dielectric layer 42, and may be formed of silicon nitride, aluminum nitride, aluminum oxide, or the like. In accordance with some embodiments, dielectric layer 42 is formed using High Density Plasma Chemical Vapor Deposition (HDPCVD), Plasma-Enhanced Chemical Vapor Deposition (PECVD), Atomic Layer Deposition (ALD), or the like.

As also shown in FIG. 1, vias 44 and bond pads 46 are formed. In accordance with some embodiments, the formation process of vias 44 and bond pads 46 includes etching dielectric layers 42, 40, and 38 to form trenches and via openings, filling the trenches and via openings with a conformal barrier layer and a metallic material, and performing a planarization process such as a Chemical Mechanical Polish (CMP) process or a mechanical grinding process to remove excess portions of the barrier layer and the metallic material. The remaining portions of the barrier layer and the metallic material are vias 44 and bond pads 46. In accordance with some embodiments, the barrier layer comprises Ti, TiN, Ta, TaN or the like. The metallic material may include copper.

Figure 11:
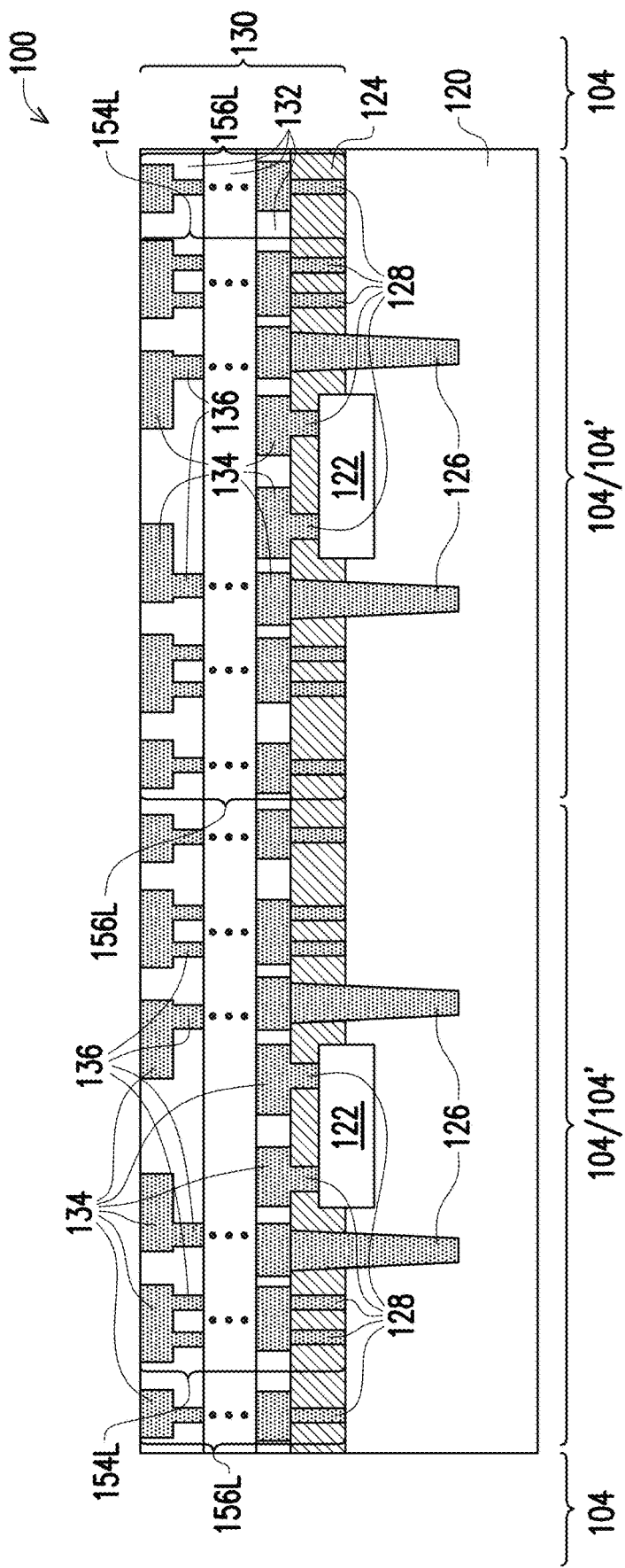
FIGS. 11-13 illustrate cross-sectional views of intermediate stages in the formation of a device die including stepped seal rings in accordance with some embodiments.
Figure 12:
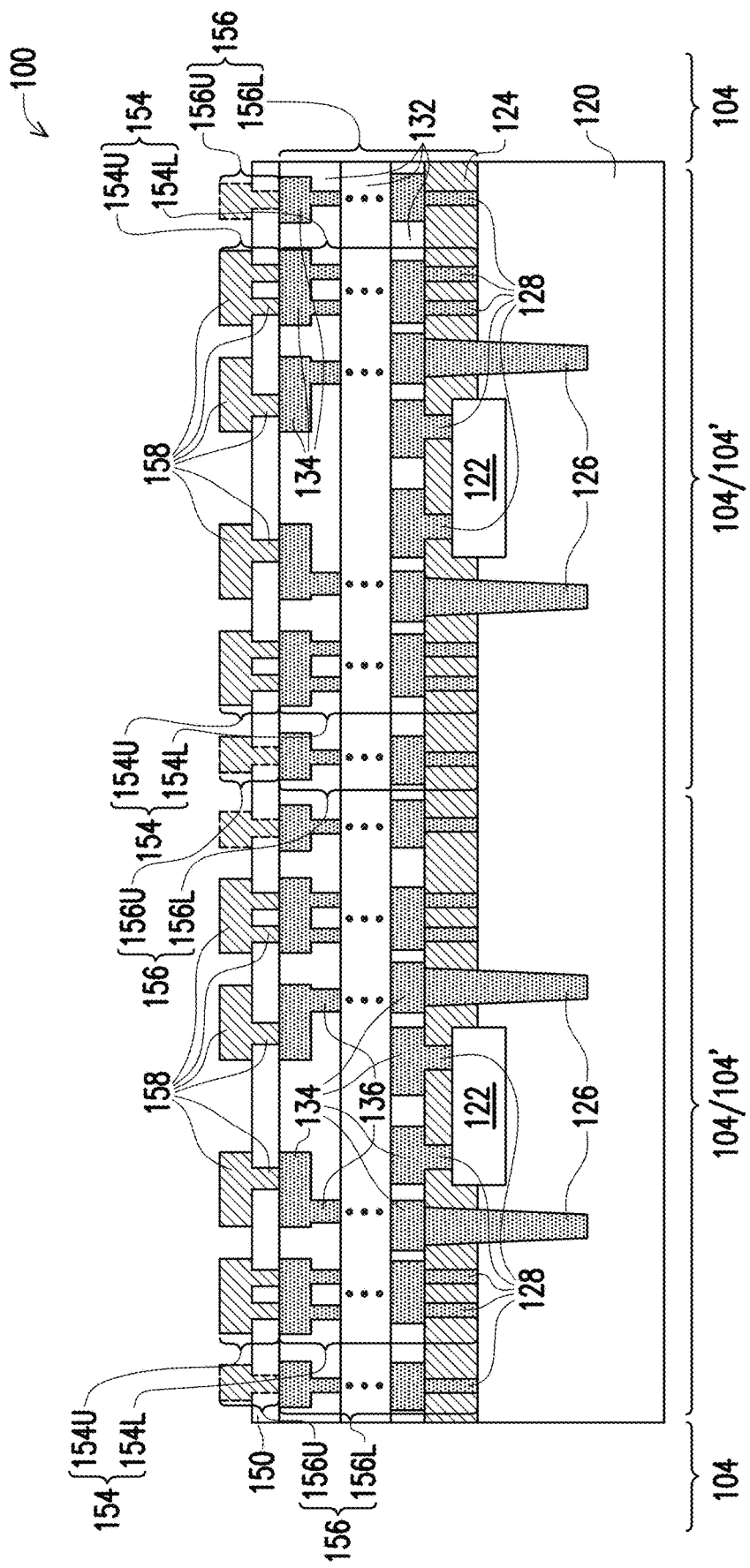
Figure 13:
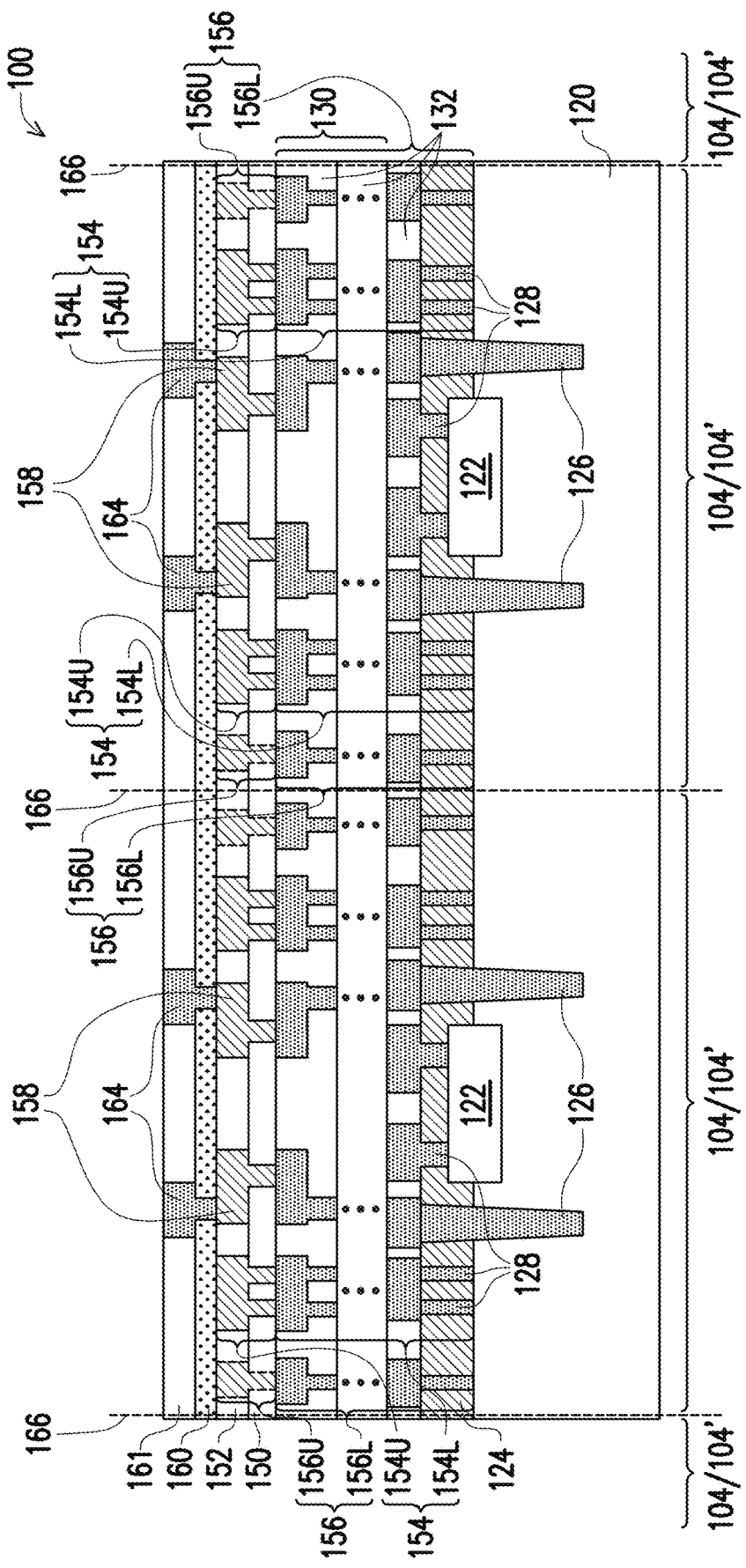

FIGS. 11 through 13 illustrate the intermediate stages in the formation of wafer 100 in accordance with some embodiments. In FIG. 11, lower portions of seal rings have been formed. The respective process is illustrated as process 204 in the process flow 200 as shown in FIG. 19. Wafer 100 includes device dies 104 therein, which will be bonded to wafer 2. In accordance with some embodiments, device dies 104 are logic dies, which may be CPU dies, MCU dies, IO dies, Base-Band dies, or AP dies. Device dies 104 may also be memory dies, packages, interposers, or the like.

Wafer 100 includes semiconductor substrate 120, which may be a silicon substrate. Through-Silicon Vias (TSVs) 126, sometimes referred to as through-semiconductor vias or through-vias, are formed to extend from a top surface of semiconductor substrate 120 to an intermediate level between the top surface and the bottom surface of semiconductor substrate 120. TSVs 126 are used to connect the devices and metal lines formed on the front side (the illustrated top side) of semiconductor substrate 120 to the backside in the resulting package.

In accordance with some embodiments, integrated circuit devices 122, which may include circuit devices such as transistors, diodes, or the like, are formed at a surface of semiconductor substrate 120. ILD 124 is formed over substrate 120. Contact plugs 128 are formed to penetrate through ILD 124, and may be electrically connected to the integrated circuit devices 122. Interconnect structure 130 may include dielectric layers 132, metal lines 134, and vias 136. The materials, the structures and the formation processes of the features in wafer 100 may be the same as the corresponding features in interconnect structure 30 (FIG. 1). The details thus may not be repeated herein. In accordance with some embodiments, metal lines 134 and vias 136 may be formed through damascene processes, and may include conformal barrier layers (such as TiN barrier layers) and filling metals on the barrier layers. The filling metals may be formed of or comprises copper, for example, with a copper atomic percentage greater than about 99 percent. Furthermore, metal lines 134 and vias 136 may be free from aluminum. Dielectric layers 132 may comprise low-k dielectric materials, for example, carbon-containing dielectric materials.

Next, referring to FIG. 12, Passivation layer 150 (sometimes referred to as passivation-1 or pass-1) is formed over interconnect structure 130. In accordance with some embodiments, passivation layer 150 is formed of a non-low-k and dense dielectric material having a dielectric constant equal to or greater than the dielectric constant of silicon oxide. Passivation layer 150 may be formed of or comprise an inorganic dielectric material, which may include a material selected from, and is not limited to, silicon nitride (SiN), silicon oxide ($SiO_2$), silicon oxy-nitride (SiON), silicon oxy-carbide (SiOC), or the like, combinations thereof, and/or multi-layers thereof.

As further illustrated in FIG. 12, metal features 158 and 154U are formed, and include some line/pad portions over passivation layer 150, and some via portions extending into passivation layer 150 to connect to the underlying features such as metal lines/pads 134. Metal features 156U are also illustrated as being dashed, which indicates that metal features 156U may be, or may not be formed. Metal features 154U and 156U are upper portions of seal rings. The respective process is illustrated as process 206 in the process flow 200 as shown in FIG. 19.

In accordance with some embodiments, metal features 158 and 154U (and 156U, if formed) are formed of a material different from the material of metal lines/pads 134 and vias 136. The material of metal features 158 and 154U may also be different from the material of the overlying bond pads 164 (FIG. 13). Accordingly, metal features 158 and 154U (and 156U, if formed) have a Coefficient of Thermal Expansion (CTE) different from the CTE of the underlying metal lines/pads 134 and vias 136 and the CTE of the overlying bond pads 164.

In accordance with some embodiments, metal features 158 and 154U may include aluminum, and may be formed of aluminum copper, or aluminum without copper therein. Assuming metal lines/pads 134 and bond pads 164 have a first aluminum atomic percentage A1AP1, which may be zero or a small value, for example, smaller than about 1 percent, metal features 158 and 154U may have a second aluminum atomic percentage A1AP2 greater than the first aluminum atomic percentage A1AP1.

In accordance with some embodiments, the second aluminum atomic percentage A1AP2 in metal features 158 and 154U may be greater than about 30 percent, and may be in the range between about 30 percent and about 90 percent. Furthermore, the difference (A1AP2−A1AP1) may be greater than about 20 percent, 80 percent, or more. Throughout the description, metal features 158 and 154U are alternatively referred to as aluminum pads 158 and aluminum upper seal ring portion 154U.

A1AP2 in metal features 158 and 154U may be greater than about 30 percent, and may be in the range between about 30 percent and about 90 percent. Furthermore, the difference (A1AP2−A1AP1) may be greater than about 20 percent, 80 percent, or more. Throughout the description, metal features 158 and 154U are alternatively referred to as aluminum pads 158 and aluminum upper seal ring portion 154U.

Metal features 158 and 154U (and 156U, if formed) are formed in common formation processes, which may include etching passivation layer 150 to form via openings (occupied by the via portions of metal features 158, 154U, and 156U). The top surface of the underlying metal lines/pads 134 are thus exposed through the via openings in passivation layer 150.

In accordance with some embodiments, metal features 158, 154U, and 156U are formed by depositing a blanket metallic material such as aluminum or aluminum copper, which includes portions extending into the via openings, followed by a photolithography process to etch the unwanted portions, leaving metal features 158, 154U, and 156U.

In accordance with alternative embodiments, the formation processes of metal features 158, 154U, and 156U include, after the formation of the via openings, depositing a metal seed layer (not shown) extending into the openings in passivation layer 150, forming a patterned plating mask (not shown), and plating a metallic material (as discussed above, and may include aluminum) into the openings in the patterned plating mask. The patterned plating mask may then be removed, followed by etching the exposed portions of the metal seed layer previously covered by the patterned plating mask. The remaining portions of the plated metallic material and the metal seed layer thus collectively form metal features 158, 154U, and 156U.

Each of device dies 104 thus includes an inner seal rings 154, and an outer seal ring 156 encircling inner seal ring 154. Inner seal ring 154 and outer seal ring 156 may be electrically floating, electrically grounded, or may be electrically connected to substrate 120. Although not shown, there may be (or may not be) additional inner seal ring(s) encircled by inner seal ring 154. Furthermore, if there are more than one additional seal rings, each of the outer seal rings in the additional seal rings encircles the respective inner seal rings in the additional seal rings. Each of the additional seal rings on the inner side of the inner seal ring 154 will also include an upper portion formed simultaneously as metal features 158 and 154U.

Inner seal ring 154 includes lower seal ring portion 154L and upper seal ring portion 154U. Outer seal ring 156 includes lower seal ring portion 156L. In accordance with some embodiments, when metal features 158 and 154U are formed, there is no seal ring portion formed directly over lower seal ring portion 156L. Accordingly, the topmost end of outer seal ring 156 is lower than the topmost end of inner seal ring 154. The topmost surface of outer seal ring 156 may be in contact with the bottom surface of passivation layer 150. Since inner seal ring 154 is higher than the outer seal ring 156 in accordance with these embodiments, seal rings 154 and 156 are referred to as stepped seal rings throughout the description.

Figure 16:
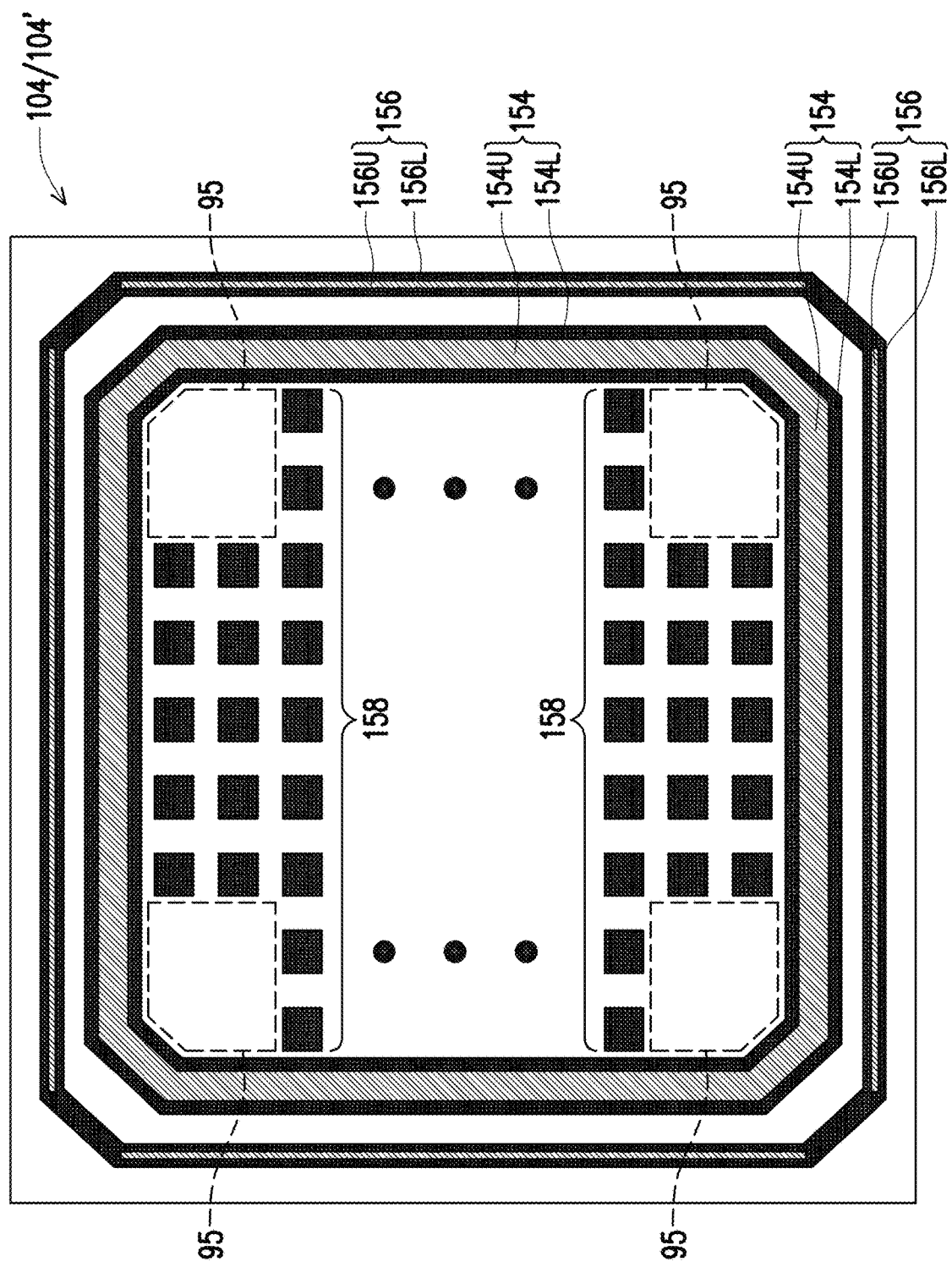

In accordance with alternative embodiments, metal feature 156U is also formed as a top portion of seal ring 156 in the same processes for forming metal features 158 and 154U. Accordingly, the topmost end of outer seal ring 156 is at the same level as the topmost end of inner seal ring 154. The topmost surface of outer seal ring 156 may thus be in contact with the bottom surface of the subsequently formed dielectric layer (such as dielectric layer 160 or passivation layer 152 (FIG. 13). In accordance with these embodiments, the upper seal ring portion 156U may be designed to be narrower than upper seal ring portion 154U, and/or may have some corner portions not formed (as shown in FIG. 16), as will be discussed in detail in subsequent paragraphs.

Referring again to FIG. 12, each of seal rings 154 and 156 includes the corresponding portions of contact plugs 128, metal lines 134, and vias 136. The respective contact plugs 128, metal lines 134, and vias 136 in the seal rings are formed at the same time, and share the same formation processes, as the respective contact plugs 128, metal lines 134, and vias 136 that are used for electrical connections. Each of the contact plugs 128, metal lines 134, and vias 136 in seal rings 154 and 156 may be physically joined with the overlying and underlying ones of these features to form an integrated seal ring. Each of the contact plugs 128, metal lines 134, and vias 136 in seal rings 154 and 156 may form a full ring without break therein when viewed from top.

Referring again to FIG. 12, each of seal rings 154 and 156 includes the corresponding portions of contact plugs 128, metal lines 134, and vias 136. The respective contact plugs 128, metal lines 34, and vias 136 in the seal rings are formed at the same time, and share the same formation processes, as the respective contact plugs 128, metal lines 134, and vias 136 that are used for electrical connections. Each of the contact plugs 128, metal lines 134, and vias 136 in seal rings 154 and 156 may be physically joined with the overlying and underlying ones of these features to form an integrated seal ring. Each of the contact plugs 128, metal lines 134, and vias 136 in seal rings 154 and 156 may form a full ring without break therein when viewed from top.

In accordance with some embodiments, the contact plugs 128 in seal rings 154 and 156 are electrically connected to semiconductor substrate 120. There may be (or may not be) silicide regions between and physically joining the corresponding contact plugs 128 and semiconductor substrate 120. In accordance with alternative embodiments, the contact plugs 128 in seal rings 154 and 156 are in physical contact with semiconductor substrate 120. In accordance with yet alternative embodiments, the contact plugs 128 in seal rings 154 and 156 are spaced apart from semiconductor substrate 120 by a dielectric layer such as a contact etch stop layer (underlying ILD 124, not shown), ILD 124, and/or the like.

Next, referring to FIG. 13, passivation layer 152 is formed over passivation layer 150. In accordance with some embodiments, as shown in FIG. 13, passivation layer 152 has a top surface coplanar with the top surfaces of metal features 158, 154U, and 156U. In accordance with alternative embodiments, passivation layer 152 is formed as a conformal layer on the sidewalls of, and covering the top surfaces of, metal features 158 and seal rings 154 and 156. In accordance with some embodiments, passivation layer 152 is formed of or comprises an inorganic dielectric material, which may include, and is not limited to, silicon nitride, silicon oxide, silicon oxy-nitride, silicon oxy-carbide, or the like, combinations thereof, and/or multi-layers thereof. The material of passivation layer 152 may be the same or different from the material of passivation layer 150. The deposition process may be performed through a conformal deposition process such as ALD, CVD, or the like.

Dielectric layers 160 and the 161 may then be formed. Dielectric layer 161 may be a bond layer, and may be formed of or comprise a silicon-containing dielectric material, which may be formed of or comprises silicon oxide, silicon oxynitride, silicon carbide, silicon oxycarbide, silicon nitride, or the like. Dielectric layer 160 is formed of a dielectric material different from the dielectric material of dielectric layer 161, and may act as an etch stop layer in the etching of dielectric layer 161 in accordance with some embodiments. Dielectric layer 160 may also be formed of or comprises silicon nitride, silicon oxynitride, silicon carbide, aluminum oxide, aluminum nitride, or the like, or multi-layers thereof. In accordance with some embodiments, inner seal ring 154 has its topmost surface below, and may be in physical contact with, the bottom surface of, dielectric layer 160. In accordance with alternative embodiments, the topmost surface of inner seal ring 154 may be in physical contact with the bottom surface of passivation layer 152, which conformally covers inner seal ring 154.

In accordance with some embodiments in which hybrid bonding is to be performed, bond pads 164 are formed in dielectric layer 161 and dielectric layer 160. The respective process is illustrated as process 208 in the process flow 200 as shown in FIG. 19. In accordance with alternative embodiments in which fusion bonding is to be performed, bond pads 164 are not formed. The formation of bond pads 164 includes etching dielectric layers 160 and 161 to form openings, through which metal features 158 are exposed, filling the openings with conductive materials, and performing a planarization process to remove excess portions of the conductive materials higher than the top surface of dielectric layer 161.

Each of bond pads 164 may also include a conformal conductive barrier layer (formed of Ti, TiN, Ta, TaN, or the like), and a metallic filling material over the conductive barrier layer. The metallic filling material may be formed of or comprises copper, and may be free from or substantially free from aluminum in accordance with some embodiments. For example, the copper atomic percentage in the metallic filling material may be higher than about 99 percent. The metallic filling material of bond pads 164 may also be the same as the metallic filling material of metal lines/pads 134.

In a subsequent process, wafer 100 is singulated, for example, sawed along scribe lines 166 to form discrete package components 104 or 104', which may be device dies. The respective process is illustrated as process 210 in the process flow 200 as shown in FIG. 19. When bond pads 164 are formed, the respective package components are denoted as package components 104, as shown in FIG. 2. When bond pads 164 are not formed, the respective package components are denoted as package components 104', as also shown in FIG. 2. Throughout the description, package components 104 and 104' are referred to as package components 104/104' to indicate that they may be package components 104 or 104'. In subsequent discussion, package components 104/104' are also referred to as device dies 104/104' in accordance with some example embodiments, while package components 104/104' may also be interposers, package substrate, packages, or the like.

Referring back to FIG. 2, device die 104 is bonded to device die 4 through hybrid bonding. The respective process is illustrated as process 212 in the process flow 200 as shown in FIG. 19. Bond pads 46 are bonded to bond pads 164 through metal-to-metal bonding, with the metal (such as copper) in bond pads 46 and 164 being inter-diffused to bond them together. Dielectric layer 42 is bonded to dielectric layer 161 through fusion bonding, with Si—O—Si bonds being generated.

In accordance with some embodiments, device die 104' is also bonded to device die 4 in accordance with some embodiments. Device die 104' may have a similar structure as device die 104, except that no bond pads are formed in the corresponding dielectric layer 161. Accordingly, fusion bonding is adopted to bond dielectric layer 42 to dielectric layer 161. Device die 104' may have the same, similar, or different circuits than device die 104. The semiconductor substrate and TSVs in device die 104' are denoted as semiconductor substrate 120' and TSVs 126', respectively.

Figure 3:
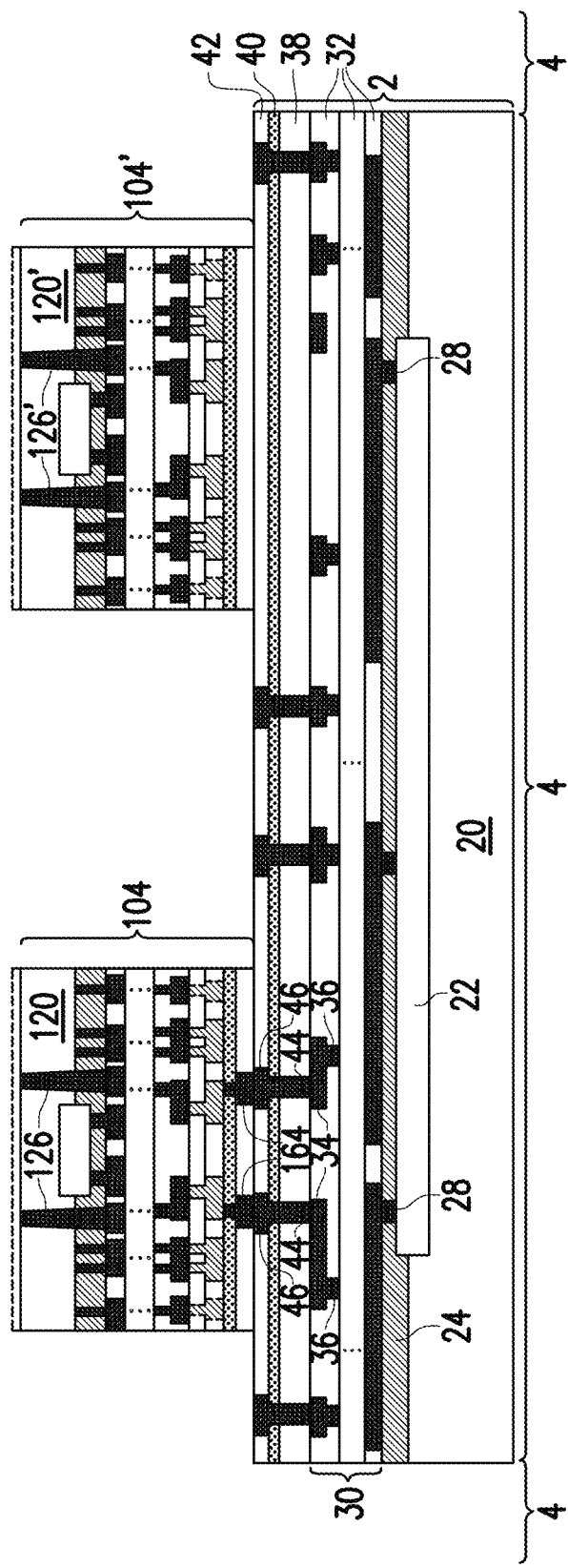
Figure 5:
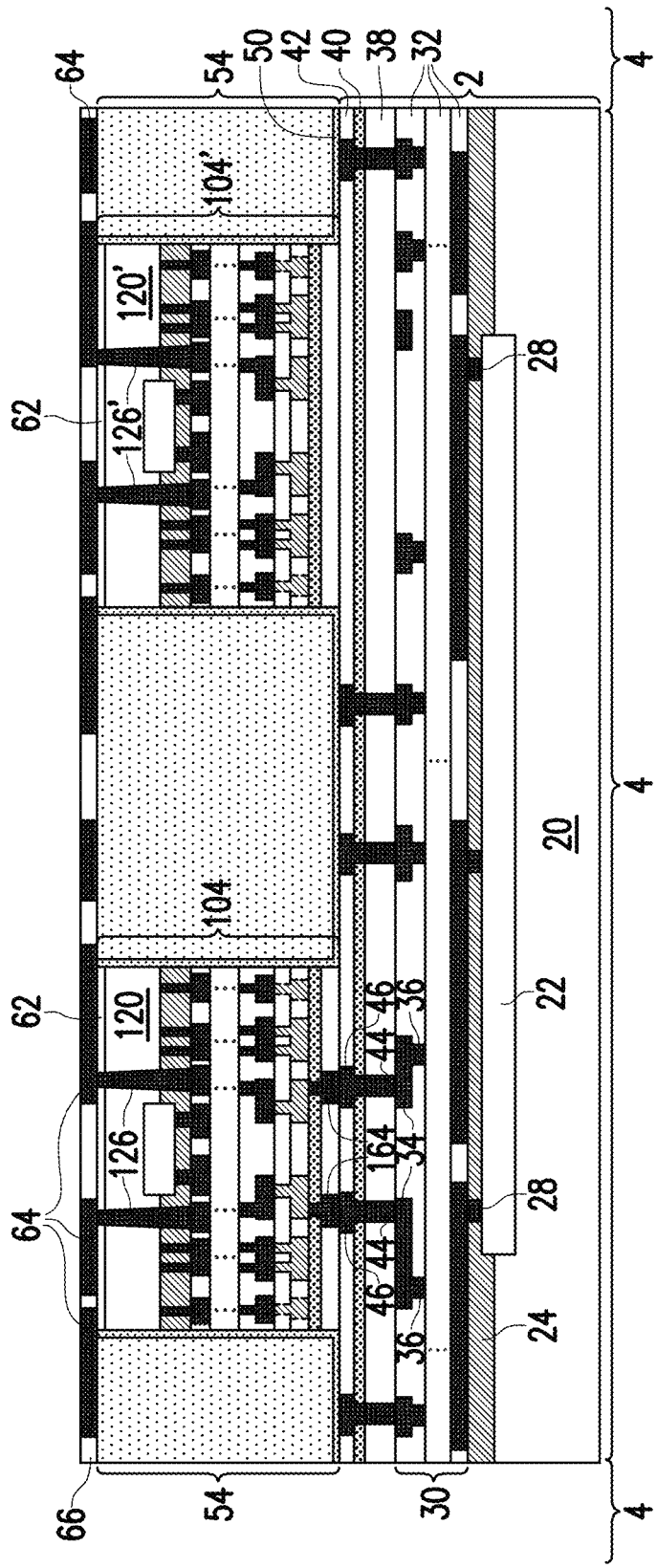

Referring to FIG. 3, in accordance with some embodiments, after the bonding process, a backside grinding process may be performed to thin device dies 104 and 104', for example, to a thickness between about 15 μm and about 30 μm. Through the thinning of device dies 104 and 104', the aspect ratio of the gaps between device dies 104 and 104' is reduced in order to perform a gap filling. Otherwise, the gap filling may be difficult due to the otherwise high aspect ratio of the gaps. After the backside grinding, TSVs 126 of device die 104 and TSVs 126' of device die 104' may be revealed. Alternatively, TSVs 126 and TSVs 126' are not revealed at this time, and the backside grinding is stopped when there are still thin layers of substrates covering TSVs 126 and TSVs 126'. In accordance with these embodiments, TSVs 126 and TSVs 126' may be revealed when gap filling layers are planarized, as shown in FIG. 5. In accordance with other embodiments in which the aspect ratio of the gaps is not too high, the backside grinding is skipped.

Figure 4:
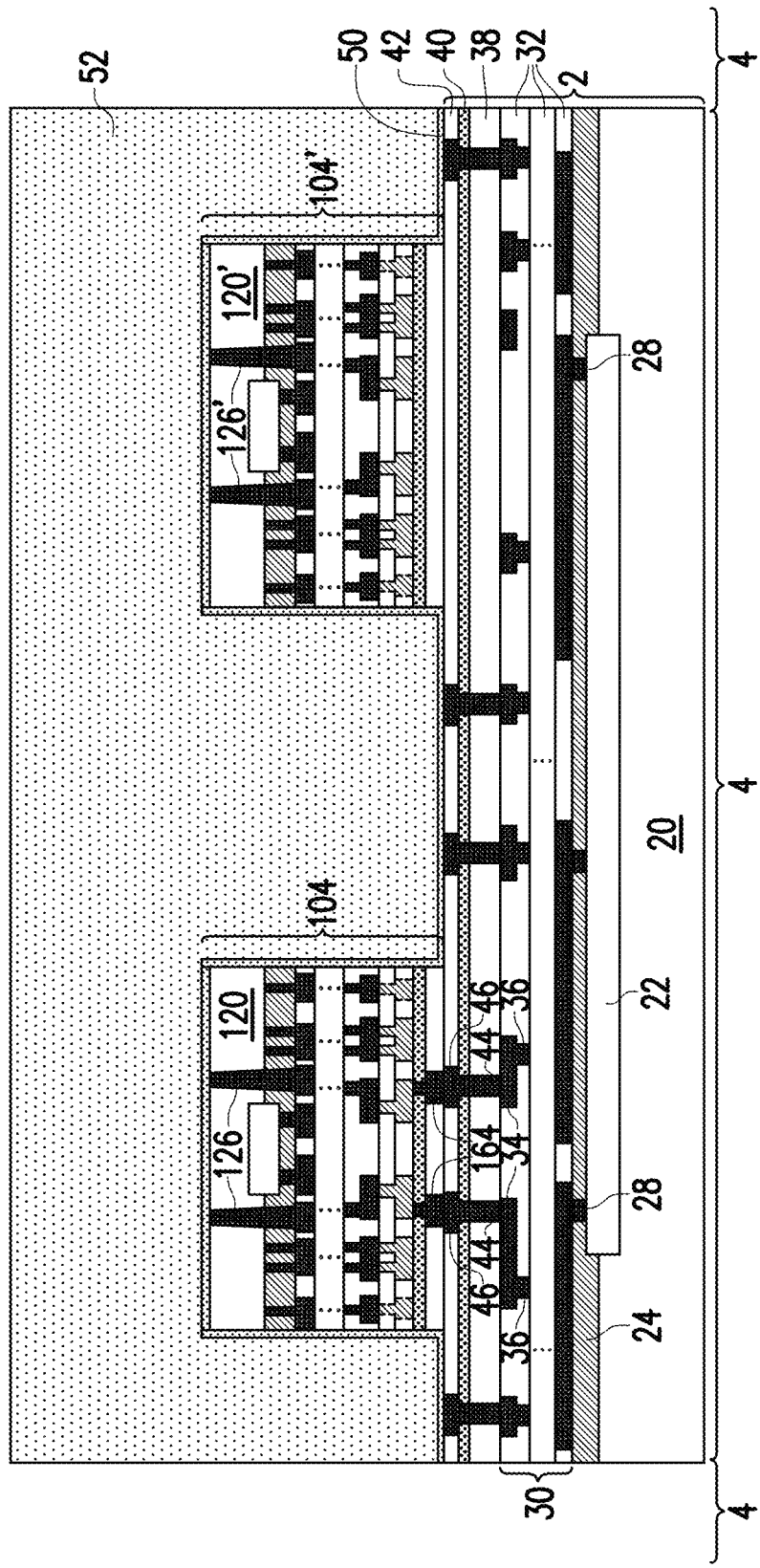

FIG. 4 illustrates the deposition of gap-filling layers, which includes dielectric layer 52 and the underlying etch stop layer 50. The respective process is illustrated as process 214 in the process flow 200 as shown in FIG. 19. Etch stop layer 50 is formed of a dielectric material that has a good adhesion to the sidewalls of device dies 104 and 104' and the top surfaces of dielectric layer 42. In accordance with some embodiments, etch stop layer 50 is formed of a nitride-containing material such as silicon nitride. Etch stop layer 50 may be formed as a conformal layer. The deposition may include a conformal deposition method such as ALD or Chemical Vapor Deposition (CVD).

Dielectric layer 52 is formed of a material different from the material of etch stop layer 50. In accordance with some embodiments, dielectric layer 52 is formed of silicon oxide, while other dielectric materials such as silicon carbide, silicon oxynitride, silicon oxy-carbo-nitride, PSG, BSG, BPSG, or the like may also be used. Dielectric layer 52 may be formed using CVD, HDPCVD, Flowable CVD, spin-on coating, or the like.

Next, a planarization process such as a CMP process or a mechanical grinding process is performed to remove excess portions of gap-filling dielectric layer 52 and etch stop layer 50, so that device dies 104 and 104' are exposed. Also, TSVs 126 and TSVs 126' are exposed. The remaining portions of dielectric layer 52 and etch stop layer 50 are collectively referred to as (gap-filling) isolation regions 54. The resulting structure is shown in FIG. 5.

Next, dielectric isolation layers 62 are formed on the back surfaces of the semiconductor substrates 120 and 120' of device dies 104 and 104', respectively. The formation process may include recessing semiconductor substrates 120 and 120', so that the top portions of TSVs 126 and 126' protrude higher than the recessed semiconductor substrates 120 and 120', respectively. A dielectric material such as silicon oxide may then be filled into the recesses, followed by a planarization process to remove excess portions of the dielectric material, and hence dielectric layers 62 are formed, and TSVs 126 and 126' are revealed through dielectric layers 62.

FIGS. 5 through 8 further illustrates the formation of RDLs, vias, metal pads, PPIs, Under-Bump Metallurgies (UBMs), and electrical connectors. The respective process is illustrated as process 216 in the process flow 200 as shown in FIG. 19. Further referring to FIG. 5, redistribution lines (RDLs) 64 and dielectric layer 66 are formed. In accordance with some embodiments, dielectric layer 66 is formed of an oxide such as silicon oxide, a nitride such as silicon nitride, or the like. RDLs 64 may be formed using a damascene process.

Figure 6:
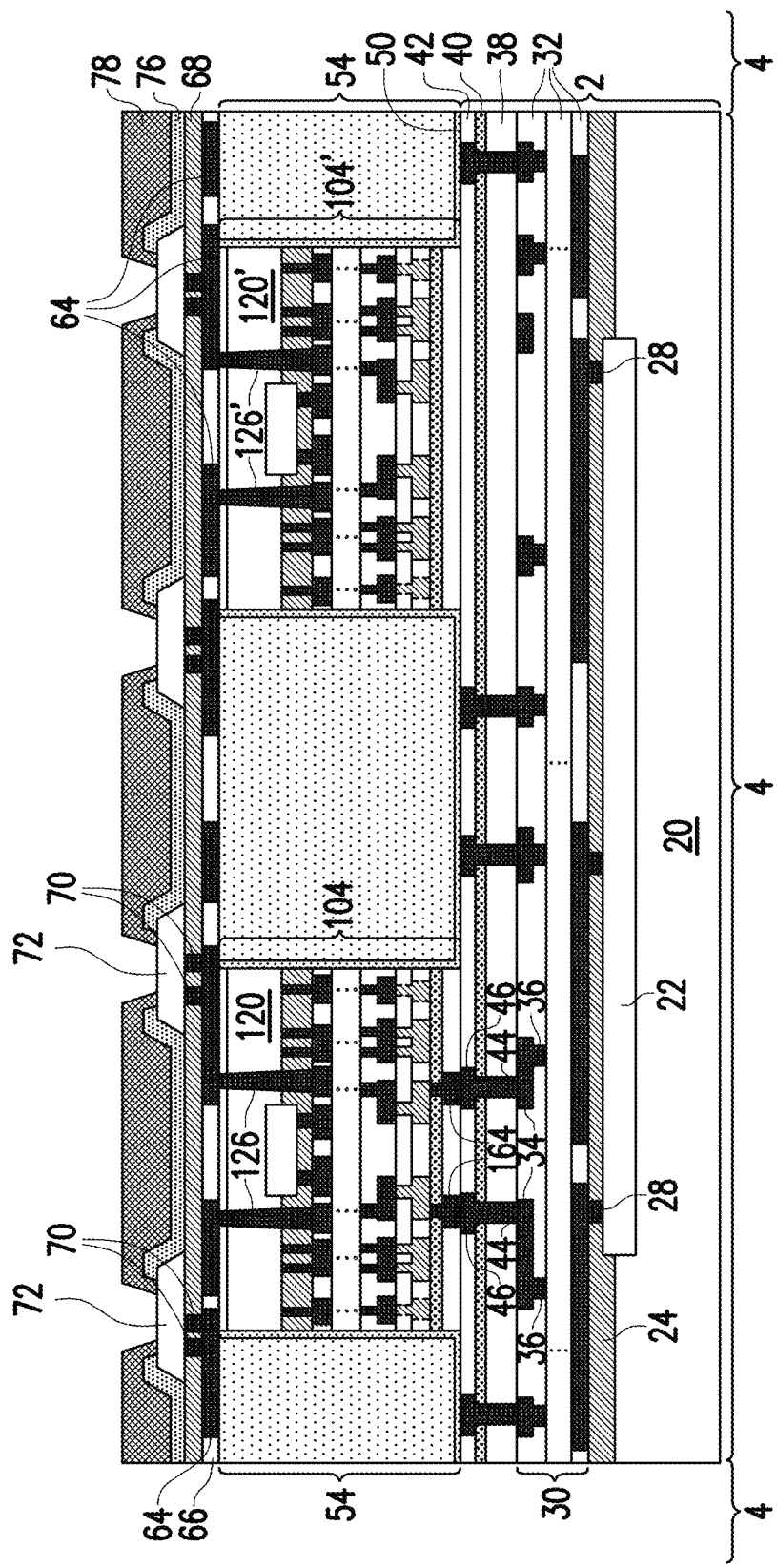
Figure 9:
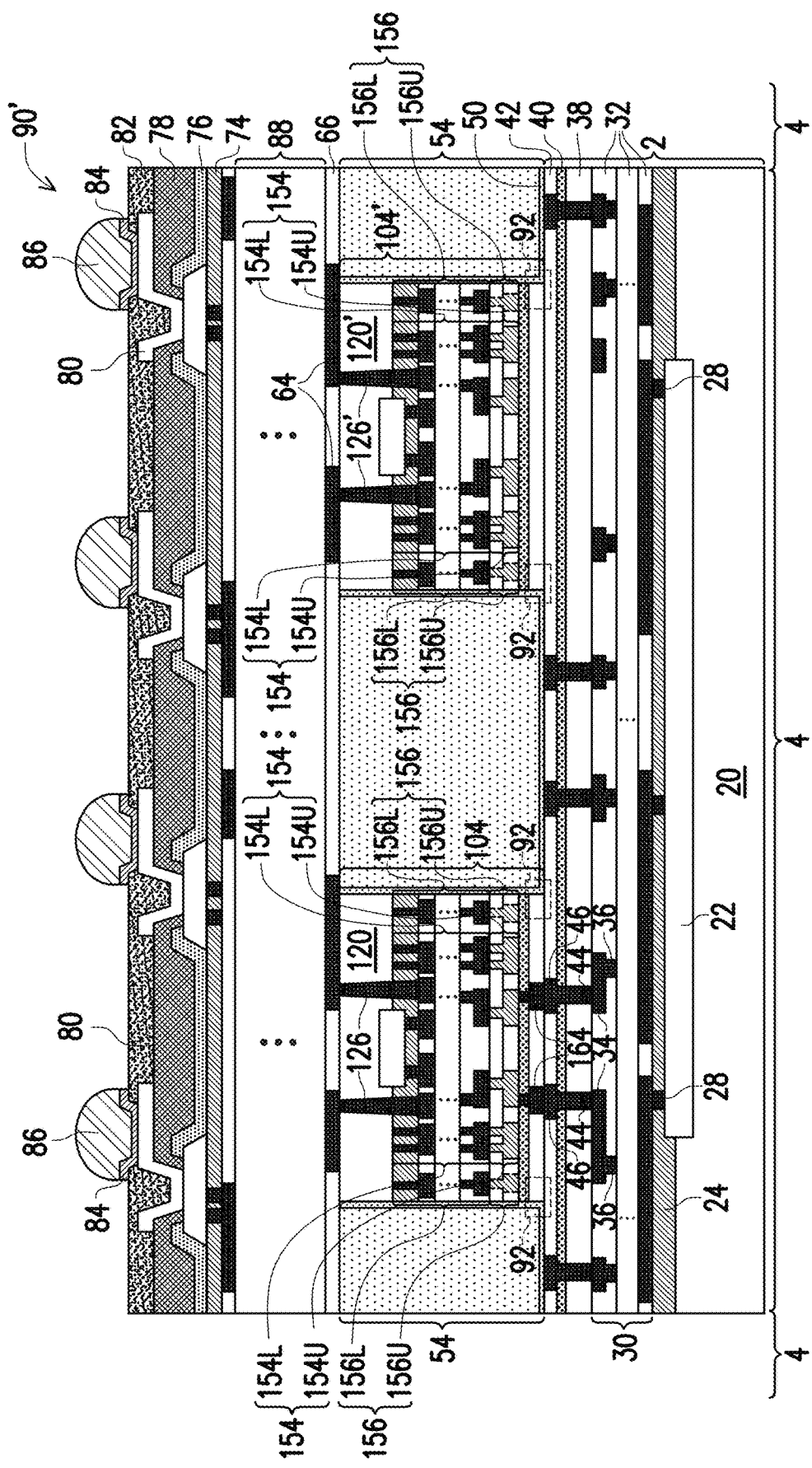
FIG. 9 illustrates the cross-sectional view of a package including a plurality of dies bonded to another device die in accordance with some embodiments.

In accordance with some embodiments, more device dies are bonded over device dies 104 and 104', as schematically illustrated in FIG. 9. In accordance with alternative embodiments, no more dies are bonded over device dies 104 and 104'. FIG. 6 illustrates the formation of electrical connection structure over device dies 104 and 104', which may include passivation layers, metal pads, and overlying dielectric layers. Passivation layer 68 (sometimes referred to as passivation-1) is formed over dielectric layer 66, and vias 70 are formed in passivation layer 68 to electrically connect to RDLs 64. Metal pads 72 are formed over passivation layer 68, and are electrically coupled to RDLs 64 through vias 70. Metal pads 72 may be aluminum pads or aluminum-copper pads, and other metallic materials may be used.

As also shown in FIG. 6, passivation layer 76 (sometimes referred to as passivation-2) is formed over passivation layer 68. Each of passivation layers 68 and 76 may be a single layer or a composite layer, and may be formed of a non-porous material. In accordance with some embodiments, each of passivation layers 68 and 76 may be a composite layer including a silicon oxide layer (not shown separately), and a silicon nitride layer (not shown separately) over the silicon oxide layer. Passivation layers 68 and 76 may also be formed of other non-porous dielectric materials such as Un-doped Silicate Glass (USG), silicon oxynitride, and/or the like.

Next, passivation layer 76 is patterned, so that some portions of metal pads 72 are exposed through the openings in passivation layer 76. Some remaining portions of passivation layer 76 cover the edge portions of metal pads 72. Polymer layer 78 is then formed, and then patterned to expose metal pads 72. Polymer layer 78 may be formed of polyimide, polybenzoxazole (PB 0), or the like.

Figure 7:
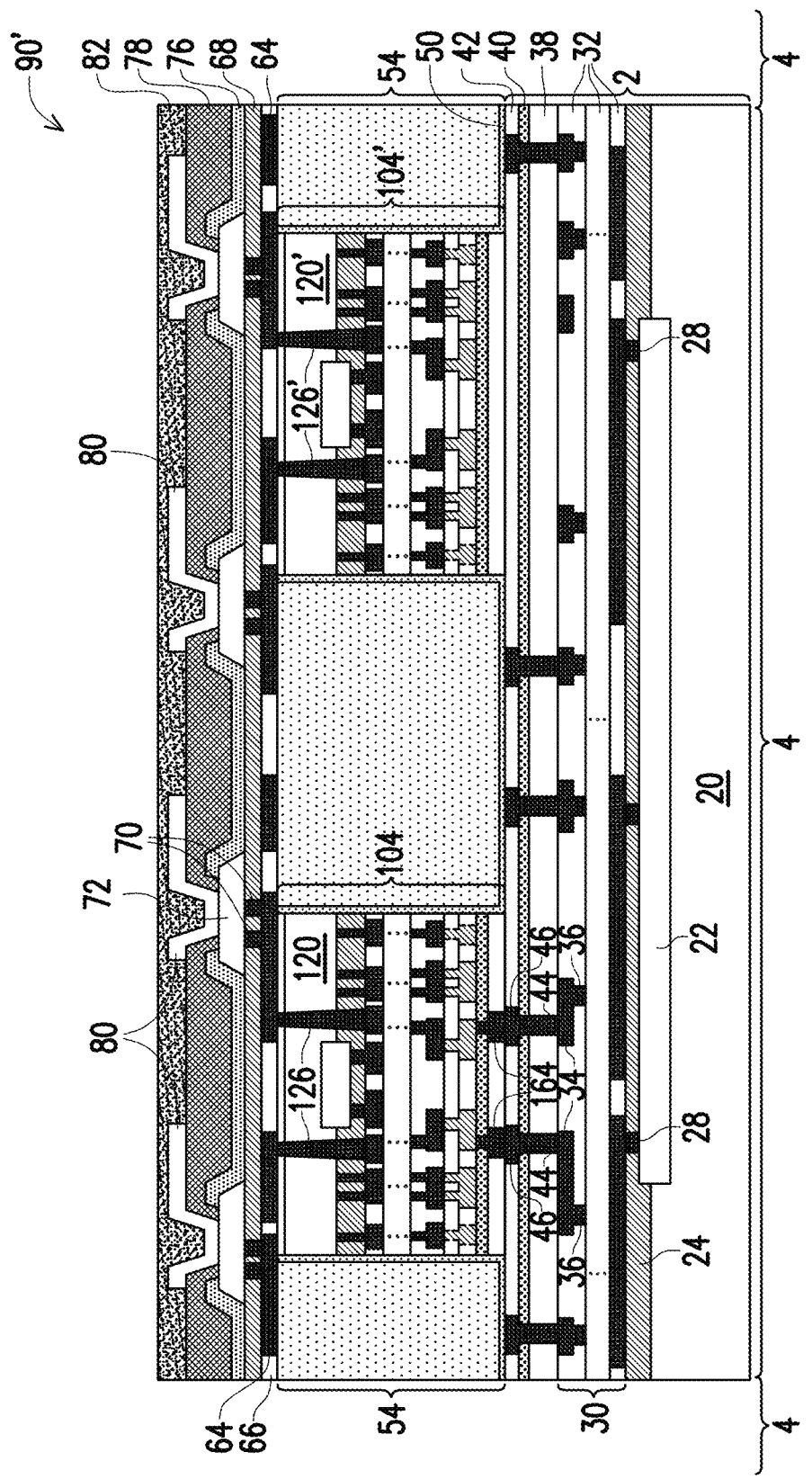

Referring to FIG. 7, Post-Passivation Interconnects (PPI) 80 are formed. The formation process may include forming a metal seed layer and a patterned mask layer (not shown) over the metal seed layer, and plating PPIs 80 in the patterned mask layer. The patterned mask layer and the portions of the metal seed layer overlapped by the patterned mask layer are then removed in etching processes. Polymer layer 82 is then formed, which may be formed of PBO, polyimide, or the like.

Referring to 8, UBMs 84 are formed. UBMs 84 extend into polymer layer 82 to connect to PPIs 80. Electrical connectors 86 are also formed, and may include solder regions, metal pillars, or the like. Reconstructed wafer 90 is thus formed. Reconstructed wafer 90 may be singulated in a sawing process to form discrete packages 90'. The respective process is illustrated as process 218 in the process flow 200 as shown in FIG. 19.

Figure 8:
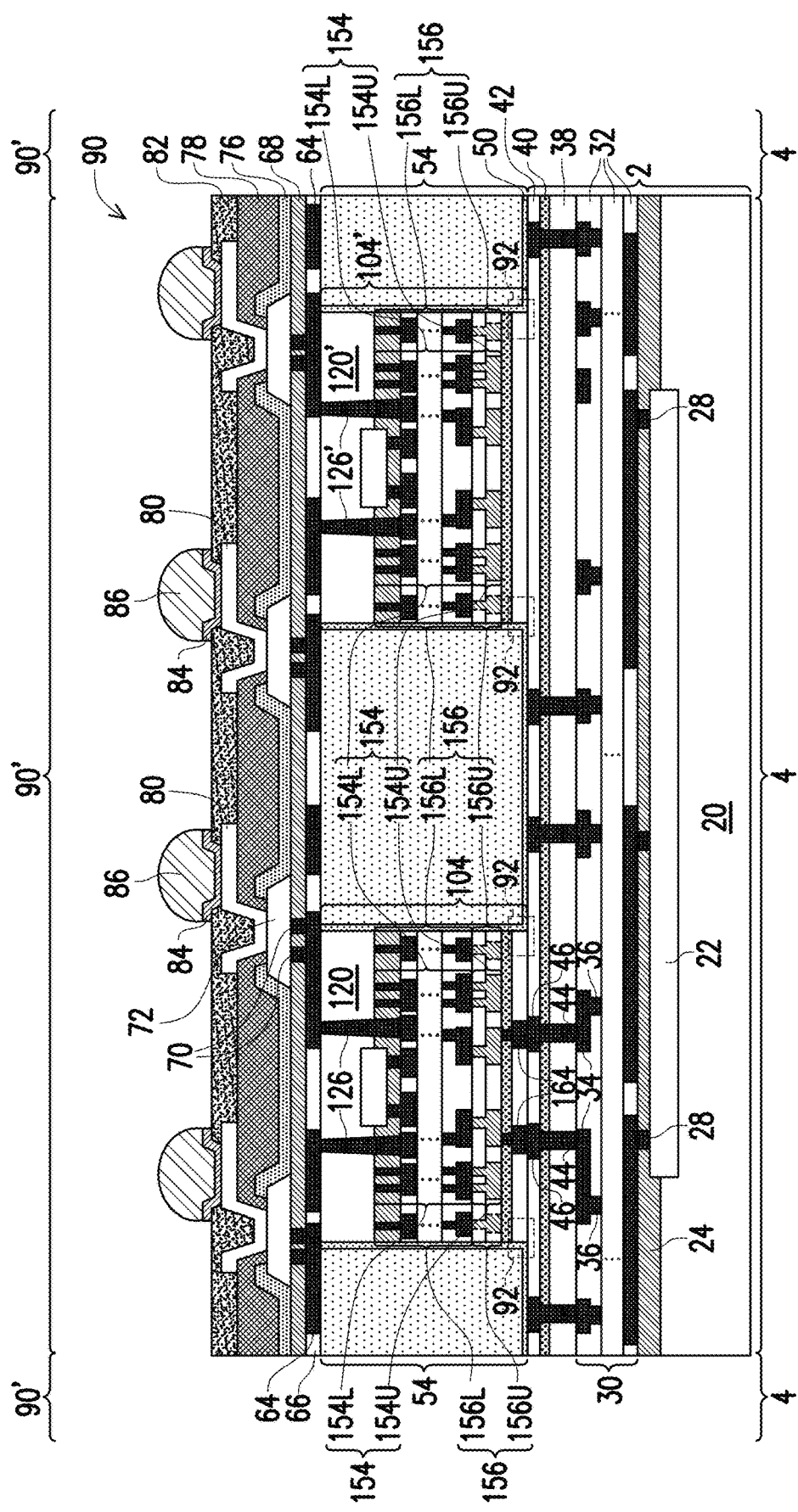

FIG. 9 illustrates a package 90' in accordance with alternative embodiment. These embodiments are similar to the embodiments as shown in FIG. 8, except that more tiers of device dies 88 are bonded over device dies 104, 104', and underlying the electrical connection structure. The details of device dies 88 (which are schematically represented in FIG. 9) may found referring to the device dies 104/104' as shown in FIG. 10.

Figure 10:
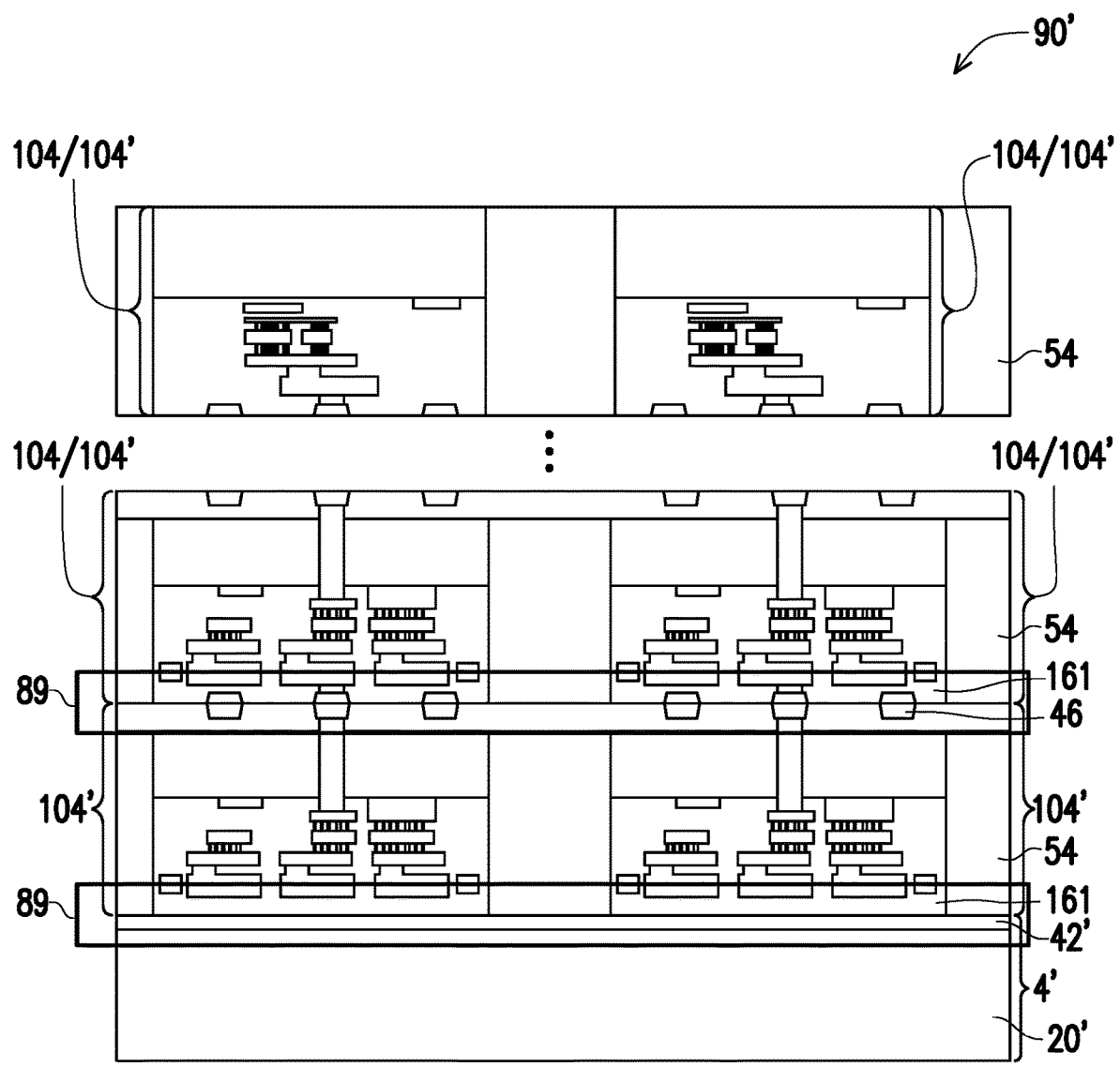
FIG. 10 illustrates the cross-sectional view of a package including a plurality of dies bonded to a carrier in accordance with some embodiments.

FIG. 10 illustrates a package 90' in accordance with alternative embodiment. These embodiments are similar to the embodiments as shown in FIG. 9, except that the first-tier device die 104' are bonded to a carrier 4', rather than on a device die (or a device wafer). The bond structures are in frames 89. In accordance with some embodiments, carrier 4' includes silicon substrate 20', which is formed of a homogeneous material, with no devices such as active devices and passive devices formed in carrier 4'. Dielectric layer 42' is formed at the top surface of carrier 4', and is used to bond to dielectric layer 161 in device dies 104'. Device dies 104' do not have bond pads at its bottom surface, and the bonding of device dies 104' to carrier 4' is through fusion bonding. Over device dies 104', there may be one or more tiers of device dies 104 and/or 104' bonded. Electrical connections (not shown) may be formed over the top tier of device dies 104/104'.

Figure 14:
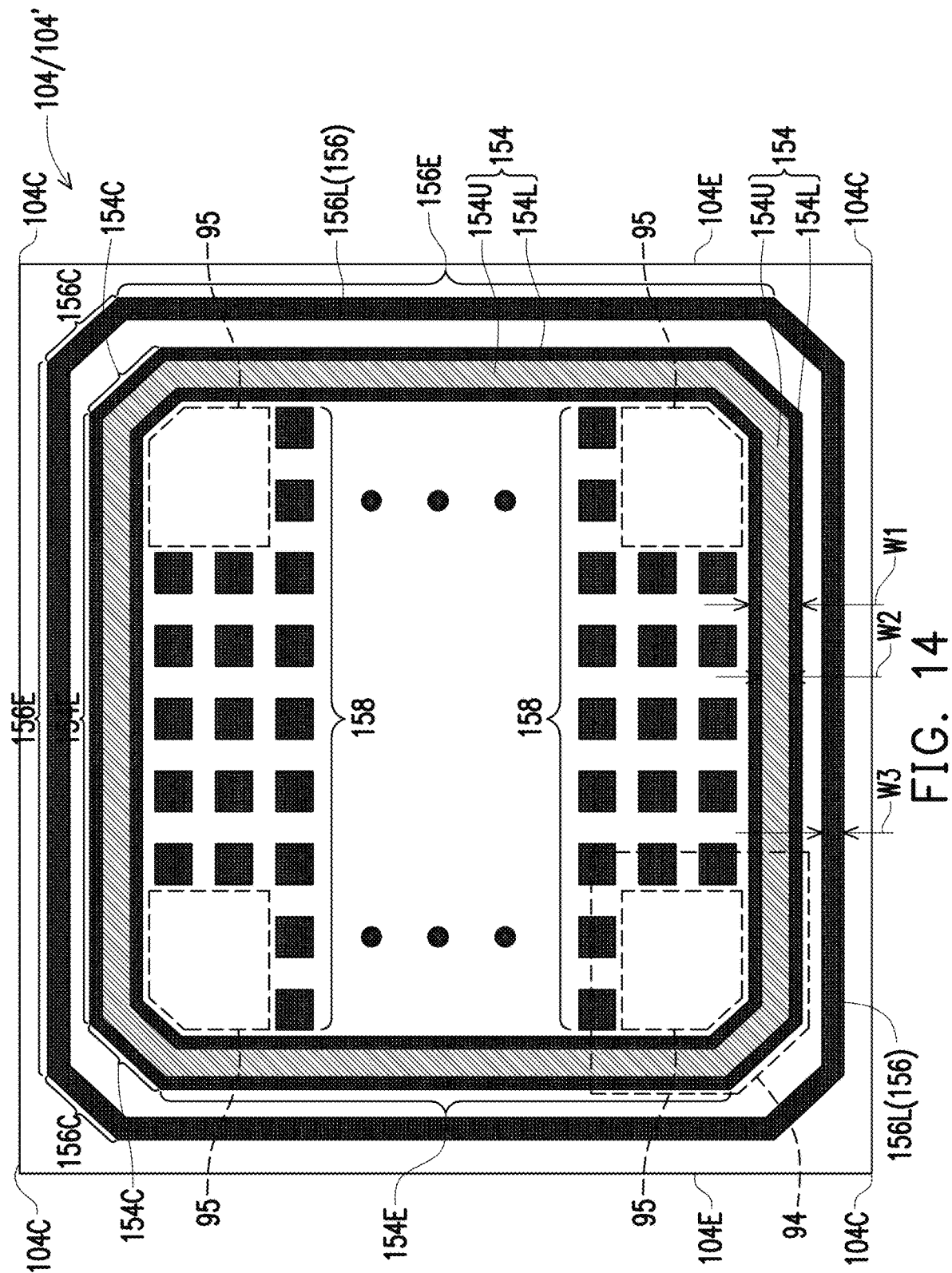
FIG. 14-16 illustrates the top views of example device dies in accordance with some embodiments.
Figure 15:
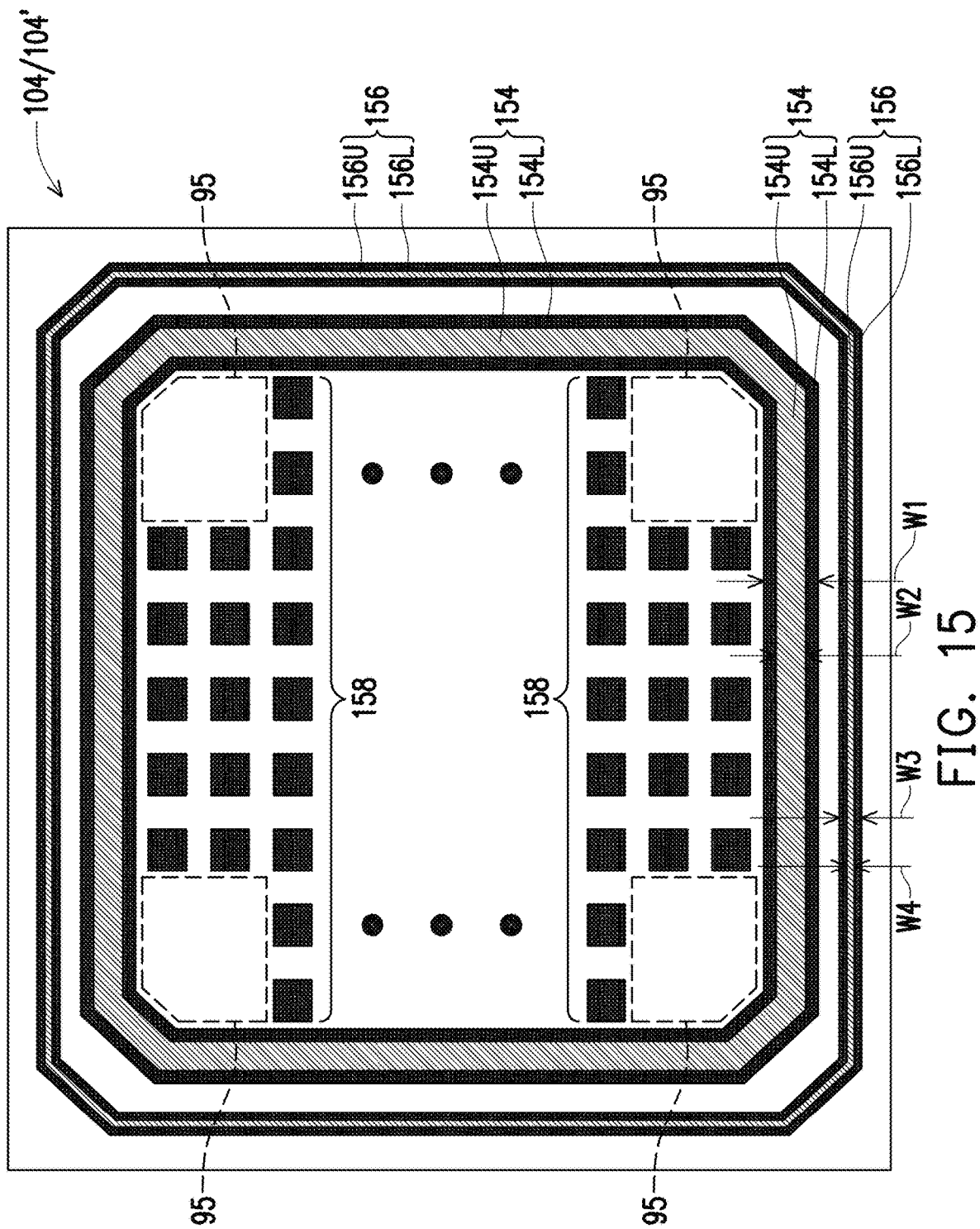

FIGS. 14, 15, and 16 illustrate the top views of device die 104 (or 104') in accordance with some embodiments. Each device die 104/104' may include inner seal ring 154 and outer seal ring 156 encircling inner seal ring 154. Each of inner seal ring 154 and outer seal ring 156 is formed as a full ring (without breaks therein) including four sections, with each section being close to and parallel to one of a corresponding edge of device die 104/104'. In the following discussion, device die 104 may be discussed, while the discussion also applies to device die 104'.

In accordance with some embodiments, device die 104 has edges 104E and corners 104C, as marked in FIG. 14. To visually distinguish upper seal ring portions 154U and 156U from the lower seal ring portions 154L and 156L, upper seal ring portions 154U and 156U are drawn to be narrower than the respective underlying lower seal ring portions 154L and 156L, while in actual structures, the width W1 (FIG. 14) of the lower seal ring portion 154L may be smaller than, equal to, or greater than the width W2 of the respective upper seal ring portion 154U. Each of seal rings 154 and 156 may include four edge portions/sections 154E and 156E, which are parallel to the nearest edges 104E. Seal rings 154 and 156 may further include corner portions 154C and 156C, respectively, which interconnect neighboring edge portions 154E and 156E. Corner portions 154C and 156C are also referred to as chamfer portions, which may form 120-degree angles with the respective edge portions/sections 154E and 156E.

In accordance with some embodiments, as addressed above, there may be addition seal ring(s) encircled by inner seal ring 154. When the addition seal ring(s) are formed, each of the additional seal rings will also have both of a lower portion extending into the same dielectric layers as lower portion 154L, and an upper portion extending into the same dielectric layers as upper seal ring portion 154U.

In accordance with some embodiments, the widths W4 of upper seal ring portion 156U may be in the range between about 0 µm and about 25 µm, with 0 µm meaning that the upper portion 156U is not formed. The width W3 of lower seal ring portion 156L may be in the range between about 0.1 µm and about 25 µm. The width W1 of lower seal ring portion 154L and the width W2 of the upper seal ring portion 154U may be in the range between about 0.2 µm and about 25 µm. Width W3 may be smaller than width W1. The ratio W3/W1 may be smaller than about 0.5 in accordance with some embodiments.

As shown in FIG. 14, inner seal ring 154 includes both of lower portion 154L and upper seal ring portion 154U, each being a full ring. Outer seal ring 156 has lower portion 156L, and does not have upper portion 156U. Upper seal ring portions 154U and 156U are formed of a material different from the materials of the lower seal ring portions 154L and 156L, and upper seal ring portions 154U and 156U have a Coefficient of Thermal Expansion (CTE) different from the CTE of lower seal ring portions 154L and 156L. Accordingly, in the bonding of device dies 104 and 104', which involves thermal processes, stress is generated proximate the interface between upper and lower portions of the seal rings. The stress is especially high at the corner portions of the seal rings close to the corners 104C of the respective device dies 104 (and 104'). The stress may cause the non-bond issue and the cracking of gap-filling regions 54 (FIG. 8) in the corner regions 92 (FIG. 8). Furthermore, the outer seal ring 156 is more likely to cause the non-bond and the cracking issues than the inner seal ring 154. Accordingly, by not forming the upper seal ring portion 156U for the outer seal ring 156, the stress is reduced. Since inner seal ring 154 is farther away from the edges and corners of device die 104/104', it has smaller effect on the stress, so that the inner seal ring 154 may have upper seal ring portion 154U formed.

FIG. 15 illustrates a top view of device die 104/104' in accordance with alternative embodiments. These embodiments are similar to the embodiments as shown in FIG. 14, except that outer seal ring 156 also includes both of lower seal ring portion 156L and upper seal ring portion 156U, each being a full ring. Furthermore, the ratio W4/W2 may be smaller than about 0.5, and may be in the range between 0 and about 0.5, or in the range between 0 and about 0.25. This means that the upper seal ring portion 156U is at least narrower than a half of the upper seal ring portion 154U, or may not be formed. Reducing the width of the upper seal ring portion 156U may reduce the stress generated due to the CTE mismatch between upper seal ring portion 156U and lower seal ring portion 156L.

FIG. 16 illustrates a top view of device die 104/104' in accordance with alternative embodiments. These embodiments are similar to the embodiments as shown in FIG. 15, except that the upper portion 156U of the outer seal ring 156 includes edge portions, and does not include corner portions. Accordingly, the upper seal ring portion 156U has breaks, and is a partial ring. Since the stress is highest at the corners of device die 104/104', and lower at the edges of device die 104/104', removing the corner portions of upper seal ring portion 156U may effectively reduce the stress, while the edge portions of upper seal ring portion 156U may still function to block a significant part of moisture from penetrating through.

Further referring to FIGS. 14, 15, and 16, device die 104/104' has corner regions, with one marked as corner region 94 in FIG. 14 as an example. The corner regions 94 include circuit clearance regions 95. The circuit clearance regions 95 do not have integrated circuit devices formed therein, and may not have routing metal lines therein. Surrounding the circuit clearance regions 95, however, there are inner seal ring 154 and aluminum pads 158. This causes significant difference in the density of aluminum pads/features, and hence the stress in these regions is high, and non-bond and cracking issues may occur. Accordingly, as shown in FIGS. 17 and 18, some dummy conductive features 158' are added into circuit clearance regions 95 to mitigate the density difference, and to reduce stress.

Figure 17:
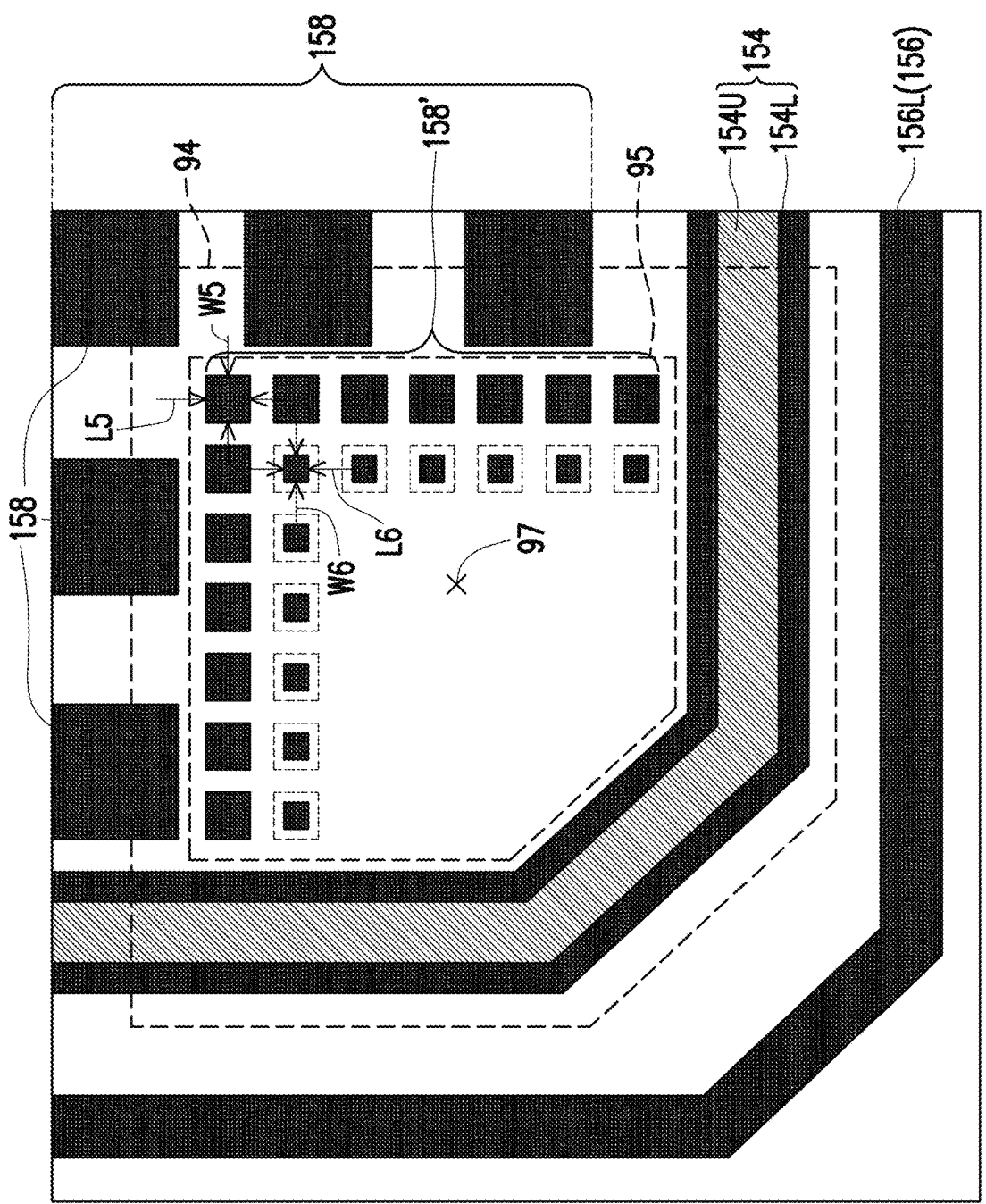
FIGS. 17 and 18 illustrate the magnified views of corner portions of some device dies in accordance with some embodiments.
Figure 18:
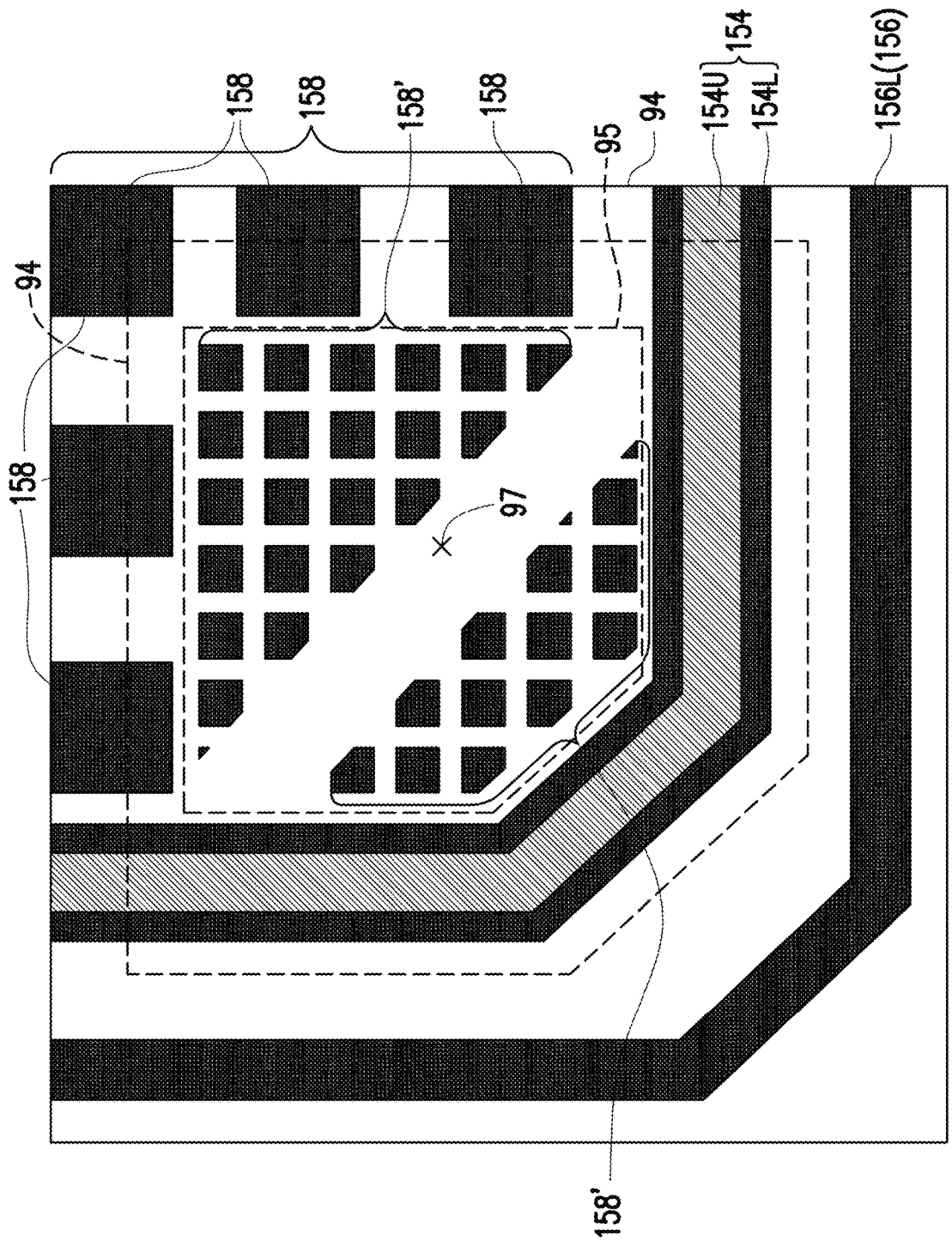

FIGS. 17 and 18 illustrate the magnified view of region 94 in FIGS. 14, 15, and 16, with some details being shown, while these details are not shown in FIGS. 14, 15, and 16. Referring to FIG. 17, a plurality of dummy conductive features 158' are formed in circuit clearance region 95. Dummy conductive features 158' are formed simultaneously as the formation of conductive features 158 and upper seal ring portions 154U and 156U (if formed). In accordance with some embodiments, dummy conductive features 158' have length L5 and width W5 in the range between about 3 μm and about 20 μm. Length L5 and width W5 may also be smaller than the lateral sizes of conductive features 158 (which may be aluminum pads).

There may be a single row and/or a single column of dummy conductive features 158' formed in circuit clearance region 95 in accordance with some embodiments. In accordance with alternative embodiments, there may be more columns and/or rows of dummy conductive features 158' formed in circuit clearance region 95. For example, dashed squares are drawn to represent the additional row/column of dummy conductive features 158'. In accordance with some embodiments, the additional row(s) and/or column(s) of dummy conductive features 158' have the same size as the first row/column of dummy conductive features 158'. In accordance with alternative embodiments, the dummy conductive features 158' closer to the center 97 of circuit clearance region 95 may be smaller than those closer to conductive features 158 and seal ring 154. For example, some dummy conductive features 158' may have length L6 and width W6 smaller than length L5 and width W5. The ratios L6/L5 and W6/W5 may be in the range between about 0.1 and about 1. Length L6 and width W6 may be in the range between about 2 μm and about 3 μm in accordance with some embodiments.

FIG. 18 illustrates an embodiment in which there are a plurality of rows and columns of dummy conductive features 158'. Similarly, the dummy conductive features 158' closer to the center 97 of circuit clearance region 95 may have equal sizes as, or may be smaller than, the dummy conductive features 158' farther away from center 97.

The embodiments of the present disclosure have some advantageous features. By eliminating (or reducing the size of) the upper portion (such as aluminum) of the outer seal ring, the stress at the corners and edges of the device dies may be reduced. The non-bond and cracking issues are thus solved. The embodiments may be applied to both of hybrid bonding and fusion bonding.

In accordance with some embodiments, a method comprises forming a first package component comprising forming a plurality of dielectric layers over a semiconductor substrate; forming a plurality of metal lines and vias in the plurality of dielectric layers; forming a lower portion of an inner seal ring and a lower portion of an outer seal ring extending into the plurality of dielectric layers; depositing a first dielectric layer over the plurality of metal lines and vias; and etching the first dielectric layer to form an opening penetrating through the first dielectric layer, wherein after the etching, a top surface of the lower portion of the inner seal ring is exposed, and an entire topmost surface of the lower portion of the outer seal ring is in contact with a bottom surface of the first dielectric layer; forming an upper portion of the inner seal ring to extend into the opening and to join the lower portion of the inner seal ring; and depositing a second dielectric layer to cover the upper portion of the inner seal ring.

In an embodiment, the method further comprises bonding a second package component over the first package component, wherein at a time the bonding is performed, a first topmost surface of the inner seal ring is higher than a second topmost surface of the outer seal ring. In an embodiment, the second package component is bonded to the first package component through fusion bonding. In an embodiment, the second package component is bonded to the first package component through hybrid bonding. In an embodiment, when the top surface of the lower portion of the inner seal ring is revealed through the opening, the entire topmost surface of the lower portion of the outer seal ring is not revealed. In an embodiment, the lower portion of the inner seal ring has a first aluminum atomic percentage, and the upper portion of the inner seal ring has a second aluminum atomic percentage higher than the first aluminum atomic percentage.

In an embodiment, the inner seal ring comprises a corner portion, with a circuit clearance region being next to the corner portion, and wherein the method further comprises, when the upper portion of the inner seal ring is formed, forming a plurality of dummy metal pads in the circuit clearance region. In an embodiment, the plurality of dummy metal pads comprise a first row closer to a center of the circuit clearance region, and a second row farther away from the center than the first row, and wherein the dummy metal pads in the first row are smaller than the dummy metal pads in the second row.

In accordance with some embodiments, a structure comprises a device die, which comprises a semiconductor substrate; a plurality of dielectric layers over the semiconductor substrate; an inner seal ring comprising a first lower portion in the plurality of dielectric layers; and an upper portion over and joined to the first lower portion; an outer seal ring encircling the inner seal ring, wherein the outer seal ring comprises a second lower portion in the plurality of dielectric layers, and wherein a first topmost surface of the inner seal ring is higher than a second topmost surface of the outer seal ring; and a first dielectric layer over and contacting the upper portion of the inner seal ring.

In an embodiment, the structure further comprises a second dielectric layer over the first dielectric layer; and bond pads extending into the second dielectric layer. In an embodiment, an entire topmost surface of the second lower portion of the outer seal ring is in contact with dielectric materials. In an embodiment, the first lower portion of the inner seal ring has a first aluminum atomic percentage, and the upper portion of the inner seal ring has a second aluminum atomic percentage higher than the first aluminum atomic percentage. In an embodiment, the outer seal ring is free from upper portions extending into same dielectric layers as the upper portion of the inner seal ring.

In an embodiment, the inner seal ring comprises a corner portion, with a circuit clearance region being next to the corner portion, and wherein the structure further comprises a plurality of dummy metal pads in the circuit clearance region, with the plurality of dummy metal pads extending into same dielectric layers as the upper portion of the inner seal ring. In an embodiment, the plurality of dummy metal pads comprise a first row closer to a center of the circuit clearance region, and a second row farther away from the center, and wherein the dummy metal pads in the first row are smaller than the dummy metal pads in the second row.

In accordance with some embodiments, a structure comprises a device die, which comprises a first seal ring, which comprises a first lower portion, wherein the first lower portion comprises first damascene structures, and comprises copper; and an upper portion over and joined to the first lower portion, wherein the first lower portion and the upper portion comprise different metals; and a second seal ring closer to edges of the device die than the first seal ring, wherein the second seal ring comprises a second lower portion comprising second damascene structures, and comprises copper, wherein a first topmost surface of the first seal ring is higher than a second topmost surface of the second seal ring.

The structure further comprises a package component over and bonded to the device die. In an embodiment, an entirety of the second topmost surface is in contact with a bottom surface of a dielectric layer. In an embodiment, the first lower portion is free from aluminum, and the upper portion comprises aluminum. In an embodiment, the device die and the package component are bonded to each other through hybrid bonding or fusion bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a first package component comprising:
    forming a plurality of dielectric layers over a semiconductor substrate;
    forming a plurality of metal lines and vias in the plurality of dielectric layers;
    forming a lower portion of an inner seal ring and a lower portion of an outer seal ring extending into the plurality of dielectric layers;
    depositing a first dielectric layer over the plurality of metal lines and vias; and
    etching the first dielectric layer to form an opening penetrating through the first dielectric layer, wherein after the etching, a top surface of the lower portion of the inner seal ring is exposed, and an entire topmost surface of the lower portion of the outer seal ring is in contact with a bottom surface of the first dielectric layer;
    forming an upper portion of the inner seal ring to extend into the opening and to join the lower portion of the inner seal ring; and
    in a same formation process for forming the upper portion of the inner seal ring, forming a conductive feature in an inner region encircled by the inner seal ring;
    depositing a second dielectric layer to cover the upper portion of the inner seal ring; and
    forming a bond pad in the inner region, wherein top surfaces of the bond pad and the second dielectric layer are coplanar, and wherein the bond pad is over and electrically connected to the conductive feature.

2. The method of claim 1 further comprising bonding a second package component over the first package component, wherein at a time the bonding is performed, a first topmost surface of the inner seal ring is higher than a second topmost surface of the outer seal ring.

3. The method of claim 2, wherein the second package component is bonded to the first package component through fusion bonding.

4. The method of claim 2, wherein the second package component is bonded to the first package component through hybrid bonding.

5. The method of claim 1, wherein when the top surface of the lower portion of the inner seal ring is revealed through the opening, the entire topmost surface of the lower portion of the outer seal ring is not revealed.

6. The method of claim 1, wherein the lower portion of the inner seal ring has a first aluminum atomic percentage, and the upper portion of the inner seal ring has a second aluminum atomic percentage higher than the first aluminum atomic percentage.

7. The method of claim 6, wherein the first aluminum atomic percentage is zero percent, and the second aluminum atomic percentage is higher than about 10 percent.

8. The method of claim 1, wherein the inner seal ring comprises a corner portion, with a circuit clearance region being next to the corner portion, and wherein the method further comprises, when the upper portion of the inner seal ring is formed, forming a plurality of dummy metal pads in the circuit clearance region, wherein the plurality of dummy metal pads are in the inner region, and are encircled by the inner seal ring.

9. The method of claim 8, wherein the plurality of dummy metal pads comprise a first row closer to a center of the circuit clearance region, and a second row farther away from the center than the first row, and wherein the dummy metal pads in the first row are smaller than the dummy metal pads in the second row.

10. A method comprising:
  forming a device die comprising:
    forming a plurality of dielectric layers over a semiconductor substrate;
    forming an inner seal ring comprising:
      a first lower portion in the plurality of dielectric layers;
      an upper portion over and joined to the first lower portion, wherein the inner seal ring comprises a corner portion formed of two side portions of the inner seal ring, wherein in a top view of the device die, the device die comprises a circuit clearance region that is adjacent to the corner portion and is encircled by the inner seal ring; and
    forming a plurality of dummy metal pads in the circuit clearance region, wherein the plurality of dummy metal pads extend into same dielectric layers as the upper portion of the inner seal ring;
    forming an outer seal ring encircling the inner seal ring, wherein the outer seal ring comprises a second lower portion in the plurality of dielectric layers, and wherein a first topmost surface of the inner seal ring is higher than a second topmost surface of the outer seal ring; and forming a first dielectric layer over and contacting the upper portion of the inner seal ring.

11. The method of claim 10 further comprising:
forming a second dielectric layer over the first dielectric layer; and
forming bond pads extending into the second dielectric layer.

12. The method of claim 10, wherein an entire topmost surface of the second lower portion of the outer seal ring is in contact with dielectric materials.

13. The method of claim 10, wherein the first lower portion of the inner seal ring has a first aluminum atomic percentage, and the upper portion of the inner seal ring has a second aluminum atomic percentage higher than the first aluminum atomic percentage.

14. The method of claim 10, wherein the outer seal ring is formed as being free from upper portions extending into same dielectric layers as the upper portion of the inner seal ring.

15. The method of claim 10, wherein the forming the plurality of dummy metal pads comprises:
forming a first row closer to a center of the circuit clearance region; and
forming a second row farther away from the center, and wherein the dummy metal pads in the first row are smaller than the dummy metal pads in the second row.

16. A method comprising:
forming a device die comprising:
forming a first seal ring comprising:
forming a first lower portion, wherein the first lower portion comprises first damascene structures, and comprises copper; and
forming an upper portion over and joined to the first lower portion, wherein the first lower portion and the upper portion comprise different metals;
forming a second seal ring closer to edges of the device die than the first seal ring, wherein the second seal ring comprises a second lower portion comprising second damascene structures, and comprises copper, and wherein a first topmost surface of the first seal ring is higher than a second topmost surface of the second seal ring;
forming a first dielectric layer over the first seal ring and the second seal ring;
forming a second dielectric layer over the first dielectric layer; and
forming bond pad in the first dielectric layer and the second dielectric layer, wherein top surfaces of the second dielectric layer and the bond pad are coplanar; and
bonding a package component to the device die.

17. The method of claim 16, wherein an entirety of the second topmost surface is in contact with a bottom surface of the first dielectric layer.

18. The method of claim 16, wherein the first lower portion is formed as being free from aluminum, and the upper portion comprises aluminum.

19. The method of claim 16, wherein the device die and the package component are bonded to each other through hybrid bonding or fusion bonding.

20. The method of claim 16, wherein the device die further comprises a circuit clearance region adjacent to a corner portion of the first seal ring, wherein the circuit clearance region is encircled by the first seal ring, and wherein the method further comprises forming a plurality of dummy metal pads in the circuit clearance region.

* * * * *